(12) United States Patent
Arita et al.

(10) Patent No.: US 8,563,962 B2
(45) Date of Patent: Oct. 22, 2013

(54) MEMORY DEVICE AND METHOD OF MANUFACTURING THE SAME

(75) Inventors: Koji Arita, Osaka (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/515,592

(22) PCT Filed: Nov. 17, 2010

(86) PCT No.: PCT/JP2010/006738
§ 371 (c)(1),
(2), (4) Date: Jun. 13, 2012

(87) PCT Pub. No.: WO2011/080866
PCT Pub. Date: Jul. 7, 2011

(65) Prior Publication Data
US 2012/0256156 A1    Oct. 11, 2012

(30) Foreign Application Priority Data

Dec. 28, 2009   (JP) .................................. 2009-297430

(51) Int. Cl.
*H01L 47/00*    (2006.01)

(52) U.S. Cl.
USPC ................... 257/4; 438/104; 257/E47.001

(58) Field of Classification Search
USPC .................... 257/4, 5, E47.001; 438/104
See application file for complete search history.

(56) References Cited

U.S. PATENT DOCUMENTS

| | | | |
|---|---|---|---|
| 6,995,999 B2 | 2/2006 | Morimoto | |
| 7,399,655 B2 | 7/2008 | Dennison | |
| 7,550,756 B2 | 6/2009 | Asano et al. | |
| 7,728,352 B2 | 6/2010 | Dennison | |
| 7,842,991 B2 * | 11/2010 | Cho et al. | ...................... 257/298 |
| 7,869,259 B2 | 1/2011 | Asao | |
| 8,022,502 B2 | 9/2011 | Kanzawa et al. | |
| 2004/0245557 A1 | 12/2004 | Seo et al. | |

(Continued)

FOREIGN PATENT DOCUMENTS

| | | |
|---|---|---|
| JP | 2004-363604 | 12/2004 |
| JP | 2005-25914 | 1/2005 |

(Continued)

OTHER PUBLICATIONS

International Search Report issued Feb. 22, 2011 in corresponding International Application No. PCT/JP2010/006738.

(Continued)

*Primary Examiner* — Quoc Hoang
(74) *Attorney, Agent, or Firm* — Wenderoth, Lind & Ponack, L.L.P.

(57) ABSTRACT

Disclosed is a memory device provided with a plurality of memory cells and a lead-out line (12) shared among the memory cells. Each memory cell is provided with a transistor (6) formed above a substrate (1) and a variable resistance element (10) having a lower electrode (7), an upper electrode (9) that comprises a noble metal, and a variable resistance layer (8) disposed between the lower electrode (7) and the upper electrode (9). The resistance value of the variable resistance layer (8) changes reversibly in response to electric pulses that go through the transistor (6) and are applied between the lower electrode (7) and the upper electrode (9). The lead-out line (12) is in direct contact with the upper electrodes (9) of the memory cells.

9 Claims, 9 Drawing Sheets

(56) References Cited

U.S. PATENT DOCUMENTS

| | | |
|---|---|---|
| 2004/0264244 A1 | 12/2004 | Morimoto |
| 2005/0029627 A1 | 2/2005 | Dennison |
| 2007/0090336 A1 | 4/2007 | Asano et al. |
| 2008/0246161 A1 | 10/2008 | Dennison |
| 2009/0224224 A1 | 9/2009 | Fujii et al. |
| 2009/0283736 A1 | 11/2009 | Kanzawa et al. |
| 2009/0296451 A1 | 12/2009 | Asao |
| 2011/0294259 A1 | 12/2011 | Kanzawa et al. |

FOREIGN PATENT DOCUMENTS

| | | |
|---|---|---|
| JP | 2007-19305 | 1/2007 |
| JP | 2007-501520 | 1/2007 |
| JP | 2007-287903 | 11/2007 |
| JP | 2008-294103 | 12/2008 |
| JP | 2008-306011 | 12/2008 |
| JP | 2009-21524 | 1/2009 |
| JP | 2009-124167 | 6/2009 |
| JP | 2009-260052 | 11/2009 |
| JP | 2009-289822 | 12/2009 |
| WO | 2005/018002 | 2/2005 |
| WO | 2008/059701 | 5/2008 |
| WO | 2008/149484 | 12/2008 |

OTHER PUBLICATIONS

Reply to Written Opinion issued Feb. 22, 2011 in International Application No. PCT/JP2010/006738 (with English translation).

\* cited by examiner (a)

(b)

(c)

(a)

(b)

(c)

(d)

(a)

(b)

(c)

(a)

(b)

(c)

(d)

MEMORY DEVICE AND METHOD OF MANUFACTURING THE SAME

TECHNICAL FIELD

The present invention relates to a memory device having memory cells each of which includes a transistor and a variable resistance element whose resistance value changes reversibly based on electrical signals, and a method of manufacturing such a memory device.

BACKGROUND ART

Recent years have seen advancement in the research and development of memory devices having memory cells with variable resistance elements. A variable resistance element is an element with a property in which its variable resistance value changes reversibly based on electric signals, and can store data corresponding to the resistance value in a nonvolatile manner.

Commonly known as a memory device using variable resistance elements is a memory device which includes memory cells, known as a 1T1R (one transistor one resistor) memory cells, arranged in a matrix at positions at which bit lines cross with word lines and source lines that are arranged orthogonally to the bit lines. Here, the 1T1R memory cells refer to memory cells each of which is formed by connecting in series a metal oxide semiconductor (MOS) transistor and a variable resistance element (see PTL 1 through 3 for example).

Disclosed in Patent Literature (PTL) 1 is a memory device including 1T1R memory cells in which oxides having a perovskite crystal structure are used as variable resistance elements.

FIG. 10 is a diagrammatic cross-sectional view of a conventional memory cell described in PTL 1. A memory cell 1011 includes a select transistor 1006 and a variable resistance element 1010. The transistor 1006 includes, on a semiconductor substrate 1001, a source region 1002 serving as a first diffusion layer region, a drain region 1003 serving as a second diffusion layer region, and a gate electrode 1005 formed on a gate oxide film 1004. The variable resistance element 1010 is formed by having a variable resistance layer 1008 disposed between a lower electrode 1007 and an upper electrode 1009. Here, the variable resistance layer 1008 is a layer whose resistance value changes in response to an applied voltage.

The drain region 1003 and the lower electrode 1007 are electrically connected and connected in series via a conductive via 1050a. The upper electrode 1009 is connected to a metal line 1012 serving as a bit line via a conductive via 1050b, and the source region 1002 is connected to a metal line 1013 serving as a source line via a conductive via 1050c. Moreover, the gate electrode 1005 is connected to a word line (not shown in the drawings). It is to be noted that PTL 1 discloses $Pr_{1-x}Ca_xMnO_3$ (PCMO), $La_{1-x}Sr_xMnO_3$ (LSMO) and so on as the materials of the variable resistance layer 1008.

Furthermore, in the memory cell 1011 constituted as describe above, application of a pulse voltage Vpp to the upper electrode 1009, a pulse voltage Vss to the source region 1002, and a pulse voltage having a predetermined voltage amplitude Vwp to the gate electrode changes the resistance state of the variable resistance layer 1008 from a low resistance state to a high resistance state. Here, Vpp is a voltage applied by a voltage switch circuit (not shown in the drawings) for writing or erasing data, Vss is a ground voltage, and Vwe is a voltage at or above a threshold value which changes the resistance state of the variable resistance element 1010 from a high resistance state to a low resistance state. Inversely, application of the pulse voltage Vss to the upper electrode 1009, the pulse voltage Vpp to the source region 1002, and a pulse voltage having a predetermined voltage amplitude Vwe to the gate electrode changes the resistance state of the variable resistance layer 1008 from a high resistance state to a low resistance state.

Similarly, disclosed in PTL 2 is a memory device including 1T1R memory cells using a tantalum oxide that is a binary oxide of a transition metal and oxygen as a variable resistance element.

Moreover, recent studies regarding variable resistance elements have found that by using a two-layered stacked structure for the variable resistance layer included in the variable resistance element, a more preferable characteristic with respect to the variable resistance element can be obtained. For example, as disclosed in PTL 3, by configuring the variable resistance layer as a stacked structure comprising a tantalum oxide having a composition represented as $TaO_x$ (where $0<x<2.5$) and a tantalum oxide having a composition represented as $TaO_y$ (where $x<y<2.5$), a forming procedure becomes unnecessary, and a variable resistance element exhibiting a high-speed, stable, reversible rewrite characteristic and a favorable resistance value retention characteristic can be realized.

CITATION LIST

Patent Literature

[PTL 1]
Japanese Unexamined Patent Application Publication No. 2005-25914
[PTL 2]
WO 2008/59701
[PTL 3]
WO 2008/149484

SUMMARY OF INVENTION

Technical Problem

It is common to use a transition metal oxide such as PCMO or $TaO_x$ (where x>o) for the variable resistance layer included in the variable resistance element, and common to use a noble metal such as platinum (Pt) as an electrode material. However, various problems arise when configuring a memory device by integrating a variable resistance element comprising a material such as these on what is known as a silicon semiconductor.

One of the problems stems from the poor adhesion of the electrode material used in the variable resistance element (especially noble metals such as Pt) to the insulating layer (usually silicon ($SiO_2$) is used). For example, in FIG. 10, a gap is created between the insulating layer 1051 and the surface and walls of the upper electrode 1009 that the insulating layer 1051 (usually $SiO_2$) covers due to the poor adhesion of the electrode material such as Pt and the $SiO_2$ included in the insulating layer 1051. Accordingly, there is a concern that the metal material used to form the conductive via 1050b will leak out from the gap when the conductive via 1050b corresponding to the upper electrode 1009 is formed. Specifically, when tungsten (W) is used as the metal material to form the conductive via 1050b, for example, tungsten hexafluoride ($WF_6$), which is used as the metal material gas, leaks out from the gap between the upper electrode 1009 and the insulating layer 1051, and W forms covering the upper electrode 1009. As a result, a shape abnormality is formed (that is, a malformation) at the interface between the upper electrode 1009 and the conductive via 1050b. This shape abnormality causes an abnormality of a characteristic with respect to the variable resistance element 1010, and is unfavorable with respect to reliability of the line connected to the upper electrode 1009. In other words, it is believed that fluctuation of the electrical characteristic of the initial resistance value and such of the variable resistance element is due to the shape abnormality formed at the interface between the upper electrode 1009 and the conductive via 1050b.

FIG. 11 is a cross-sectional SEM photograph of a variable resistance element experimentally manufactured using Pt in the upper electrode and $SiO_2$ in the insulating layer. In normal circumstances, W is only formed inside a contact hole provided for forming the conductive via. However, in FIG. 11, W leaks out from the contact hole for the conductive via and covers a portion of the upper electrode at the interface between the upper electrode and the conductive via (the portion inside the white dashed line labeled with a W in FIG. 11). As a result, the formation of a shape abnormality can be confirmed at the interface between the upper electrode 1009 and the conductive via 1050b.

Moreover, usually, to form a conductive via corresponding to an upper electrode of a variable resistance element, an insulating layer (usually $SiO_2$) which covers the upper electrode is formed, then a contact hole which penetrates through the insulating layer reaching the upper electrode is formed using a common dry etching method, and a metal material (usually W) is filled inside the contact hole by CVD. Here, during the process of dry etching which forms the contact hole, dry etching is performed by over etching, whereby the upper electrode exposed in the contact hole is slightly etched so etching residue from the insulating layer is not generated. As a result, the film thickness of the portion of the upper electrode on the bottom of the formed contact hole which was etched is thicker than the film thickness of the portion of the upper electrode which was not etched. In other words, a concave shape is formed on the upper electrode. It is to be noted that, in this circumstance, because dry etching using a higher density plasma is used when the contact hole is miniaturized, the formation of the concave shape on the upper electrode is prone to occur to a higher degree in the over etching process.

Thus, in a variable resistance element in which a conductive via is formed, the occurrence of film thickness unevenness of the upper electrode at the time the conductive via is formed is unavoidable. It is believed that this unevenness in film thickness of the upper electrode leads to a fluctuation in the electrical characteristic of the initial resistance value and such of the variable resistance element. This point will be discussed in further detail afterwards.

Upon creation of the present invention, the inventors newly discovered that the initial resistance value of the variable resistance element is dependent on the film thickness of the upper electrode included in the variable resistance element. This point will be explained hereinafter.

FIG. 12 is a graph showing initial resistance values of a variable resistance element including an upper electrode comprising Pt, a variable resistance layer comprising $TaO_x$, and a lower electrode comprising tantalum nitride (TaN) when the film thickness of the Pt included in the upper electrode is 5 nanometers (nm), 10 nm, and 20 nm.

In FIG. 12, for each Pt film thickness, initial resistance values for three types of variable resistance elements are shown for when the area of the upper electrode is 0.5 square micrometers ($\mu m^2$), 1 $\mu m^2$, and 5 $\mu m^2$. Approximately 40 elements having these three types of electrodes were experimentally manufactured and measured for initial resistance value. The median values are shown in FIG. 12. It is to be noted that when the test elements were made, before depositing the upper electrode on the variable resistance layer, an oxygen plasma treatment is administered to a surface of the variable resistance layer using an ashing device, whereby the variable resistance layer is formed as stacked structure including a tantalum oxide having a composition represented as $TaO_x$ (where $0<x<2.5$) and a thickness of 23 nm, and a tantalum oxide having a composition represented as $TaO_y$ (where $x<y$) and a thickness of 8 nm, as is shown in PTL 3.

A trend can be interpreted from FIG. 12 in which the initial resistance value of the variable resistance element increases as the layer thickness of the upper electrode comprising Pt is made thinner.

When Pt is used in the upper electrode, a micro-protrusion forms in a downward facing direction in post processing after the formation of the upper electrode. FIG. 13 is a cross-sectional TEM photograph of a variable resistance element comprising Pt after undergoing this type of post processing. The shape of the micro-protrusion formed on the upper electrode protruding in the direction of the variable resistance layer (here $TaO_x$ is used) can be seen in the dashed-line circle in this photograph. This is a change the Pt layer undergoes during a heating process which is part of the post process procedure. In other words, this is a process which causes the Pt atoms to migrate toward the $TaO_y$ when the Pt layer is heated to a high temperature. The bulk of the protrusion can be seen to be growing from the area of the grain boundaries of the Pt layer. This thought to be due to the propensity for migration to occur along the grain boundaries of the Pt layer.

As a result of further examination, the inventors discovered that the growth of this protrusion is dependent on the film thickness of the upper electrode, and that the growth of the protrusion is suppressed when the film thickness of the upper electrode is thin. With respect to a special characteristic of the variable resistance element, it is believed the overall resistance value of the variable resistance layer decreases when the protrusion is present in comparison to when the protrusion is not present due to the film thickness of the variable resistance layer becoming substantially thin in the portion of the protrusion. In FIG. 12, when the thickness of the Pt included in the upper electrode is 5 nm, the initial resistance value of the variable resistance layer increases, and when the thickness of the Pt is 20 nm, the initial resistance value of the variable resistance layer decreases, reflecting the inclination described above.

The fluctuation of the initial resistance value of the Pt with a thickness of 10 nm in FIG. 12 is markedly greater than the other samples because the film thickness of Pt in the vicinity of 10 nm reaches a threshold level for the generation of the protrusion described above. In other words, when the Pt film thickness is approximately 10 nm, the generation of the protrusion is inconsistent, occurring in some instances and not in others. This inconsistency is believed to be the cause of the fluctuation seen in the initial resistance value. The same phenomenon can also be observed in materials other than Pt such as palladium (Pd). Moreover, this phenomenon can also be observed in the variable resistance layer with compositions such as $HfO_x$ or $ZrO_x$ in addition to $TaO_x$.

Considering how this dependency affects the characteristics of an actual variable resistance element, the occurrence of film thickness unevenness (due to the film thickness of the upper electrode exposed in the contact hole being thinner than in the other ones) of the upper electrode at the time the contact hole is formed is unavoidable in a variable resistance element in which a conductive via is formed. Consequently, the fluctuation of the initial resistance value of the variable resistance element is also unavoidable, which is undesirable.

As described above, as a result of the shape abnormality formed at the interface between the upper electrode and the conductive via, as well as the film thickness unevenness of the upper electrode as a result of over etching at the time the contact hole is formed in order to form the conductive via, an electrical characteristic of the variable resistance element such as the initial resistance value also becomes unstable.

Accordingly, the object of the present invention is to solve the problems outlined above by providing a memory device having variable resistance elements in which initial resistance value fluctuations are suppressed by improving the physical connection shape between an electrically connected a line and an upper electrode of the variable resistance elements, and by reducing the film thickness unevenness of the upper electrode.

Solution to Problem

In order to solve the problems outlined above, the memory device according to an embodiment of the present invention comprises a plurality of memory cells and a lead-out line provided in common to the plurality of memory cells, wherein each of the memory cells includes a transistor formed above a substrate and a variable resistance element which includes a lower electrode, an upper electrode comprising a noble metal, and a variable resistance layer disposed between the lower electrode and the upper electrode, the variable resistance layer having a resistance value that changes reversibly in response to an electric pulse that go through the transistor and are applied between the lower electrode and the upper electrode, and the lead-out line being in direct contact with the upper electrode included in each of the memory cells.

The lead-out line is a line formed by a first patterning of a conductive film. In other words, it is a line in contact with the upper electrode without the use of a via. Moreover, the bottommost surface of the bottom surfaces of the lead-out line is formed to be lower than the top surface of the upper electrode.

With this configuration, a contact hole forming process (dry etching process) can be omitted at the time of forming the conductive via because the line connected to the upper electrode included in the variable resistance element is in direct contact with the upper electrode without the disposition of the conductive via. Consequently, film thickness unevenness of the upper electrode that occurs during contact hole formation is avoided. As a result, fluctuation of the initial resistance value of the variable resistance element that originates from the film thickness unevenness of the upper electrode can be reduced. Moreover, because the upper electrode included in the variable resistance element is in direct contact with the lead-out line, the contact area of the upper electrode and the insulating layer decreases, and a gap will not form between the upper electrode and the insulating layer. Additionally, because a conductive via connected to the upper electrode is not formed, the leaking of metal material (usually W) used to form the conductive via is avoided, and the physical connection shape (contact shape) between the electrically connected the line and the upper electrode included in the variable resistance element can be improved.

Moreover, when an electrical connection via a conductive via is used, like in the conventional configuration shown in FIG. 10, the amount of current that can flow to the variable resistance element is limited by the amount of current that can flow to the conductive via (which depends on the cross-sectional area of the conductive via and the electromigration property of the material used in the conductive via). On the other hand, with the configuration described above, the electrical connection portion between the upper electrode and the lead-out line can be increased to the size of the area of the upper electrode. Supposing that a current with a current density comparable to when a conductive via is used can flow, one can deduce that an amount of current that can flow to the variable resistance element is sufficiently greater than in the conventional configuration. Additionally, when a suitable material is selected for the lead-out line, a sufficiently great current can flow to the variable resistance element, and the degree of freedom can be increased with respect to the selection of material used in the variable resistance element (in particular the variable resistance layer) and to the operation setting values of the variable resistance element (and the memory device).

Moreover, it is preferable that (i) the variable resistance layer include a first layer comprising a first oxygen-deficient transition metal oxide having a composition represented as $MO_x$ (where M denotes a transition metal and O denotes oxygen) and a second layer comprising a second oxygen-deficient transition metal oxide having a composition represented as $MO_y$ (where x<y) formed on the first layer, and (ii) the second layer be in contact with the upper electrode.

When tantalum oxide is used, the variable resistance layer is formed having a stacked structure comprising a tantalum oxide having a composition represented as $TaO_x$ (where 0<x<2.5) and a tantalum oxide having a composition represented as $TaO_y$ (where x<2.5). As a result, a forming procedure becomes unnecessary, and a variable resistance element exhibiting a high-speed, stable, reversible rewrite characteristic and a favorable resistance value retention characteristic can be realized. Consequently, a memory device exhibiting favorable characteristics can be realized.

Moreover, it is preferable that at least a portion of a side wall of the variable resistance layer be covered by an insulating layer.

With this configuration, at least a portion of the side walls of the variable resistance layer are covered by the insulating layer. For example, because the portion of the variable resistance layer in contact with an interlayer insulating layer is strongly oxidized during the formation of the interlayer insulating layer, the resistance of the side walls of the variable resistance layer increases (the variable resistance layer becomes insulative). For this reason, even if the variable resistance layer is exposed in the etch-back process and brought into contact with the lead-out line, current will not flow from the portion in contact. Consequently, with this configuration, the etch-back margin can be increased in the process exposing the upper electrode at the time the lead-out line is formed.

Moreover, it is preferable that the variable resistance layer comprise an oxygen-deficient transition metal oxide selected from the group consisting of tantalum (Ta), hafnium (Hf), and zirconium (Zr).

With this configuration, when the variable resistance layer comprises an oxide such as $TaO_x$ (where 0<x<2.5), $HfO_x$ (where 0<x<2.0) and $HfO_y$, or $ZrO_x$ (where 0<x<2.0), the portion of the variable resistance layer in contact with the interlayer insulating layer is strongly oxidized to a further degree in the process depositing the interlayer insulating layer to cover the variable resistance element. In other words, the resistance of the side walls of the interlayer insulating layer increases (the interlayer insulating layer becomes insulative). Thus, current can only flow to the variable resistance layer through the upper electrode and the lower electrode.

Moreover, it is preferable that the lead-out line have a stacked structure comprising an electrically conductive material, and a portion of the lead-out line that is in direct contact with the upper electrode comprises an electrically conductive material including at least one of: chromium (Cr), molybdenum (Mo), niobium (Nb), tantalum (Ta), tungsten (W), titanium (Ti), vanadium (V), zirconium (Zr), hafnium (Hf), silicon (Si), nitrogen (N), carbon (C), and boron (B).

With this configuration, by using a material having a high electromigration hardness such as the transition metals Cr, Mo, Nb, Ta, W, Ti, V, Zr, or Hf, the chemical compounds silicide, nitride, carbide, or boride in the line which is in direct contact with the upper electrode included in the variable resistance element, a sufficiently great current can flow to the variable resistance element. Accordingly, the degree of freedom can be increased with respect to the selection of material used in the variable resistance element and to the operation setting values of the variable resistance element (and the memory device). Furthermore, having a layer comprising a transition metal such as those described above or a chemical compound such as silicide, nitride, carbide, or boride and deposited between the line and the insulating layer and between the upper electrode and line is advantageous in that the layer also functions as an adhesion layer.

Moreover, a method of manufacturing a memory device according to an aspect of the present invention comprises: forming the transistor above a substrate; forming a lower electrode of the variable resistance element to correspond to the transistor; forming a variable resistance layer on the lower electrode; forming an upper electrode comprising a noble metal on the variable resistance layer; forming an interlayer insulating layer so as to cover the variable resistance element; exposing at least a portion of a top surface of the upper electrode; and forming a lead-out line that is provided in common to the plurality of memory cells so as to be in direct contact with the upper electrode.

With this configuration, film thickness unevenness of the upper electrode that occurs during contact hole formation is avoided because the line connected to the upper electrode included in the variable resistance element is in direct contact with the upper electrode without the disposition of the conductive via. As a result, fluctuation of the initial resistance value of the variable resistance element that results from the film thickness unevenness of the upper electrode can be reduced. Moreover, because the upper electrode included in the variable resistance element is in direct contact with the lead-out line, the contact area of the upper electrode and the insulating layer decreases, and a gap will not form between the upper electrode and the insulating layer. Additionally, because a conductive via connected to the upper electrode is not formed, the leaking of metal material (usually W) used to form the conductive via can be avoided, and the contact shape can be improved.

Moreover, when an electrical connection via a conductive via is used, the amount of current that can flow to the variable resistance element is limited by the amount of current that can flow to the conductive via (which depends on the cross-sectional area of the conductive via and the electromigration property of the material used in the conductive via). On the other hand, with the configuration described above, the electrical connection portion between the upper electrode and the lead-out line can be increased to the size of the area of the upper electrode. Supposing that a current with a current density comparable to when a conductive via is used can flow, one can deduce that an amount of current that can flow to the variable resistance element is sufficiently greater than in the conventional configuration. Additionally, when a suitable material is selected for the lead-out line, a sufficiently great current can flow to the variable resistance element, and the degree of freedom can be increased with respect to the selection of material used in the variable resistance element (in particular the variable resistance layer) and to the operation setting values of the variable resistance element (and the memory device). Furthermore, because a photomask which defines the conductive via connected to the upper electrode is unnecessary, the number of photomasks used can be decreased by one layer, thereby shortening the manufacturing process.

Moreover, it is preferable that (i) forming, in the variable resistance layer, a first layer comprising an first oxygen-deficient transition metal oxide having a composition represented as $MO_x$ (where M denotes a transition metal and O denotes oxygen), and (ii) forming, on the first layer, a second layer comprising a second oxygen-deficient transition metal oxide having a composition represented as $MO_y$ (where x<y), be included.

When tantalum oxide is used, the variable resistance layer is formed having a stacked structure comprising a tantalum oxide having a composition represented as $TaO_x$ (where 0<x<2.5) and a tantalum oxide having a composition represented as $TaO_y$ (where x<2.5). As a result, a forming procedure becomes unnecessary, and a variable resistance element exhibiting a high-speed, stable, reversible rewrite characteristic and a favorable resistance value retention characteristic can be realized. Consequently, a memory device exhibiting favorable characteristics can be manufactured.

Moreover, it is preferable that the exposing (i) include planarizing the interlayer insulating layer, and (ii) exposes at least a portion of the upper electrode on a surface of the interlayer insulating layer after planarizing the interlayer insulating layer.

With this configuration, in the process planarizing the interlayer insulating layer, damage to the upper electrode can be prevented while at the same time exposing the upper electrode.

Moreover, it is preferable that in the forming of a lead-out line, the lead-out line and an other line be formed at the same time.

With this configuration, the process of manufacturing the line can be simplified due to the lead-out line and the other line being formed at the same time.

Advantageous Effects of Invention

With the present invention, it is possible to provide a memory device and a method of manufacturing the memory device having variable resistance elements in which initial resistance value fluctuations are suppressed by improving the physical connection shape between an electrically connected a line and an upper electrode of the variable resistance elements, and by reducing the film thickness unevenness of the upper electrode.

Hereinafter, embodiments of present invention are described with reference to the drawings. It is to be noted that the present invention is explained with reference to the succeeding embodiments and drawings, but these are intended to be examples, and the present invention is not intended to be limited thereto.

(First embodiment)
[Configuration of the Memory Device]

Figure 1:
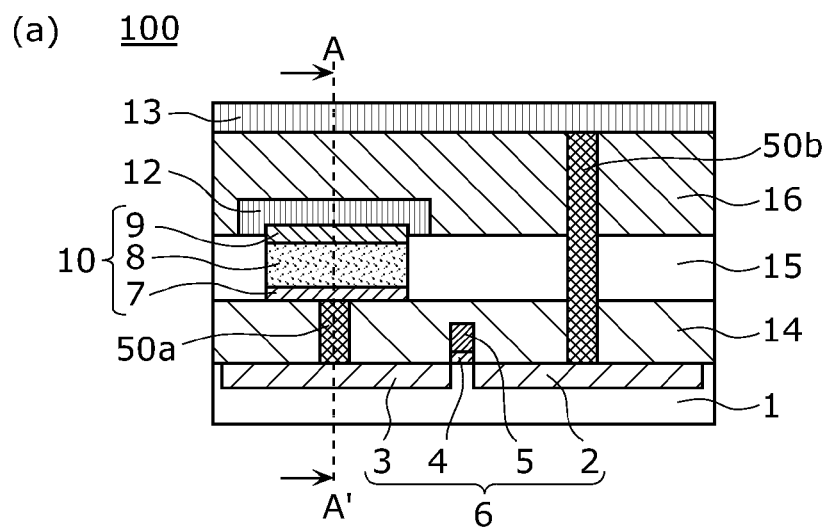
FIG. 1 is a diagrammatic view of the memory device according to the first embodiment, including: (a) a cross-sectional view showing a configuration of the memory device; (b) a cross-sectional view as viewed from the direction of the arrow along the line A-A' shown in (a); and (c) a plain view as viewed from the surface of (a).
Figure 1:
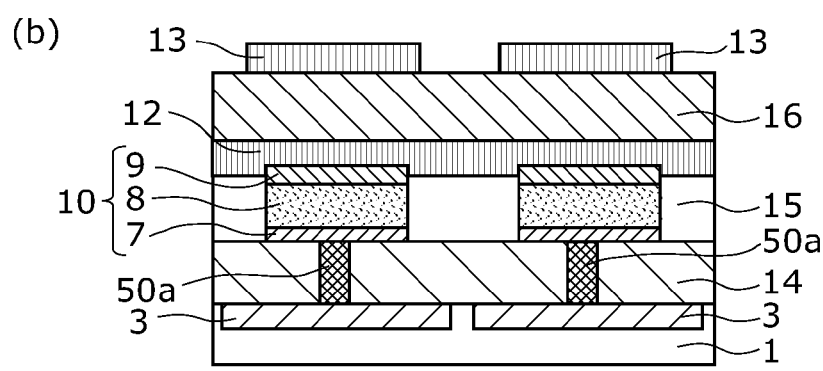
Figure 1:
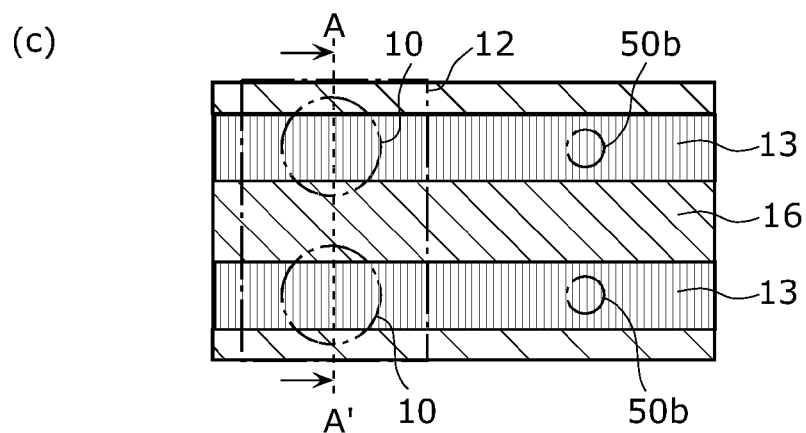

FIG. 1 is a diagrammatic view of the memory device according to the first embodiment. FIG. 1 (a) is a cross-sectional view showing a configuration of the memory device, FIG. 1 (b) is a cross-sectional view as viewed from the direction of the arrow along the line A-A' shown in FIG. 1 (a), and FIG. 1 (c) is a plain view as viewed from the surface of FIG. 1 (a). It is to be noted that in FIG. 1 (c), a number of constituents of the memory device which cannot be seen from the surface are shown with dashed lines and labeled with reference numerals.

A memory device 100 is provided with a plurality of 1T1R memory cells. Specifically, each of the memory cells is formed from a select transistor 6 and a variable resistance element 10 connected in serial via a conductive via 50a. The select transistor 6 includes, manufactured above a substrate 1 having a semiconductor, a source region 2, a drain region 3, a gate oxide film 4, and a gate electrode 5 formed on the gate oxide film 4.

The variable resistance element 10 includes a variable resistance layer 8 which is disposed between a lower electrode 7 and an upper electrode 9 and whose resistance value changes in response to an applied voltage. Here, the lower electrode 7 and the drain region 3 are electrically connected via the conductive via 50a. According to the first embodiment, the variable resistance element 10 has a cylindrical shape. In other words, the variable resistance element 10 has a cylindrical shape when viewed from above, as is shown in FIG. 1 (c). It should be noted that the variable resistance element 10 is not limited to this shape, and may be formed into a rectangular-parallelepiped-shape, for example. Moreover, the gate electrode 5 is connected to a word line (not shown in the drawings).

Additionally, an interlayer insulating layer 15 is deposited in the vicinity of the variable resistance element 10. A lead-out line 12 (for example a bit line) is deposited on the upper portion of the upper electrode 9 included in the variable resistance element 10 so as to cover the upper electrode 9. A lead-out line is a line formed by a first patterning of a conductive film. In other words, it is a line in contact with the upper electrode without the use of the via. As shown in FIG. 1 (b), the lead-out line 12 is provided in common to a plurality of the memory cells. Moreover, the bottommost surface of the bottom surfaces of the lead-out line 12 is formed to be lower than the top surface of the upper electrode 9. In other words, the lead-out line 12 is formed to cover the entire surface as well as a portion of the side walls of the upper electrode 9, and furthermore is formed on the interlayer insulating layer 15 within a predetermined range from the upper electrode 9. It is to be noted that the lead-out line 12 may also be formed to cover a portion of the upper electrode 9 and not the entire top surface of the upper electrode 9, and on a portion of the interlayer insulating layer 15 within a predetermined range from the upper electrode 9.

Here, when a predetermined electric pulse is applied to the variable resistance layer 8 included in the variable resistance element 10, the resistance state of the variable resistance layer 8 transitions reversibly between a low resistance (LR) state (hereinafter referred to as LR state) and a high resistance (HR) state (hereinafter referred to as HR state). The resistance state of the variable resistance layer 8 is maintained after a transition as long as the predetermined electric pulse is not applied. According to the first embodiment, the LR state and the HR state are assigned with respective binary data (0 or 1), and electric pulses having different polarities are applied in order to cause the resistance state of the variable resistance layer 8 to transition between the LR state and the HR state. A perovskite metal oxide, a transition metal oxide, or a portion of typical metal oxides can be used as the variable resistance layer.

Specifically, the variable resistance layer 8 can comprise an oxygen-deficient $TaO_x$ (where $0<x<2.5$), $HfO_x$ (where $0<x<2.0$), or $ZrO_x$ (where $0<x<2.0$), for example, and have a stacked structure including a high resistance layer and a low resistance layer. In this case, by regulating the thickness of the high resistance layer, what is called the forming process (a process applying an electric stimulation to the variable resistance element directly after manufacturing to develop resistive state changes) becomes unnecessary, and it becomes possible to control the value of the current flowing in the variable resistance element. Details regarding relevant knowledge gained from test results can be found in, for example, PTL 3, and are therefore omitted here.

Specifically, when $TaO_x$ (where $0<x<2.5$) is used in the variable resistance layer 8, it is preferable for the variable resistance layer 8 to have a stacked structure including a first layer (low-concentration oxide) comprising an oxygen-deficient tantalum oxide having a composition represented as $TaO_x$ (where $0.7 \leq x \leq 1.9$), and a second layer (high-concentration oxide) comprising a second oxygen-deficient tantalum oxide having a composition represented as $TaO_y$ ($2.1 \leq y \leq 2.5$). Here, the oxygen-deficient tantalum oxide is a tantalum oxide having a non-stoichiometric composition whose oxygen content (atomic ratio: ratio of number of oxygen atoms to total number of atoms) is less than a tantalum oxide having a stoichiometric composition. When this stacked structure is used, the second layer (high-concentration oxide layer) is deposited so as to be in contact with the upper electrode 9.

With this configuration, the resistivity of the $TaO_x$ decreases (becomes a low resistance layer), and the resistivity of the $TaO_y$ increases (becomes a high resistance layer). By adopting this configuration, the variable resistance element 10 exhibiting a high-speed, stable, reversible rewrite characteristic and a favorable resistance value retention characteristic can be realized. Details regarding relevant knowledge gained from test results can be found in PTL 3, and are therefore omitted here.

Moreover, the upper electrode 9 includes a noble metal. It is preferable that one of a material or a plurality of materials having a higher standard electrode potential than a standard electrode potential of a transition metal included in the variable resistance layer 8 be used as the noble metal included in the upper electrode 9, and it is preferable that a material having a lower standard electrode potential than the standard electrode potential of a material included the upper electrode 9 be used in the lower electrode 7 (for example W, Ni, or TaN). That is, when the variable resistance layer 8 comprises tantalum oxide and the standard electrode potential of the lower electrode 7 is represented as $V_1$, the standard electrode potential of the tantalum as $V_{Ta}$, and the standard electrode potential of the upper electrode as $V_2$, it is preferable that the difference of the standard electrode potential $V_1$ of the lower electrode 7 and the standard electrode potential $V_{Ta}$ of the tantalum, represented as $V_1 - V_{Ta}$, and the difference of the standard electrode potential $V_2$ of the upper electrode and the standard electrode potential $V_{Ta}$ of the tantalum, represented as $V_2 - V_{Ta}$, fulfill the relationship: $0 < V_1 - V_{Ta} < V_2 - V_{Ta}$. Moreover, it is preferable that the difference of the standard electrode potential $V_1$ of the lower electrode 7 and the standard electrode potential $V_{Ta}$ of the tantalum, represented as $V_1 - V_{Ta}$, and the difference of the standard electrode potential $V_2$ of the upper electrode 9 and the standard electrode potential $V_{Ta}$ of the tantalum, represented as $V_2 - V_{Ta}$, fulfill the relationship: $V_1 - V_{Ta} \leq 0 < V_2 - V_{Ta}$.

By adopting such a configuration, a resistance changing phenomenon can occur stably at the variable resistance layer 8 which is in contact with the upper electrode 9.

Figure 4:
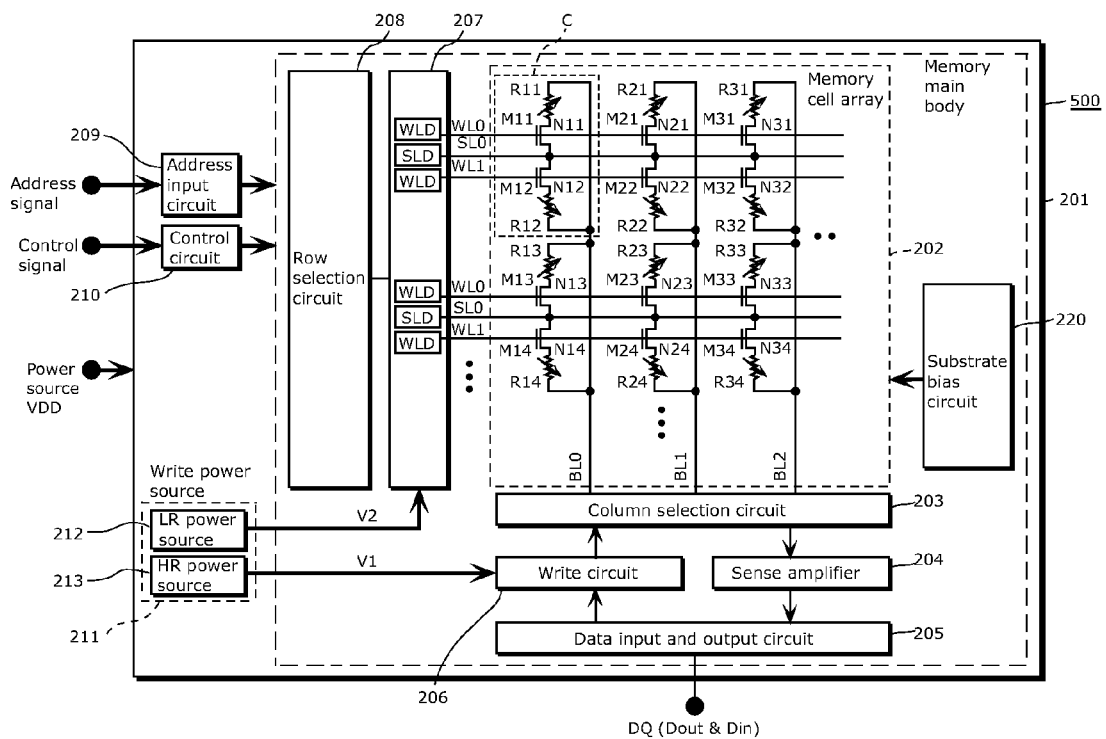
FIG. 4 is a block diagram showing a configuration of the nonvolatile memory device according to the first embodiment.

Furthermore, a second insulating layer 16 comprising for example $SiO_2$ is disposed on the lead-out line 12 and the interlayer insulating layer 15. A metal line 13 (for example a source line) is disposed on the second insulating layer 16. As shown in FIG. 1 (*c*), the metal line 13 is provided in common to a plurality of the memory cells. The source region 2 included in the select transistor 6 is connected, via a conductive via 50b, to a diffusion layer serving as a source line, or the metal line 13. The gate electrode 5 of the select transistor 6 included in the memory cell is connected to the word line (not shown in the drawings), and the upper electrode 9 included in the variable resistance element 10 or one of the diffusion layers of the transistor (for example, the source region 2) is connected to a bit line (not shown in the drawings). It is to be noted that, as is shown in FIG. 4 (to be described later), the word lines and the bit lines are disposed so as to cross each other. A plurality of the memory cells are disposed in an array in the direction of the word lines and the bit lines, forming a memory cell array.

It is to be noted that the variable resistance layer 8 was exemplified as having a stacked structure of tantalum oxide, but the functionality described above is not limited to the use of a stacked structure comprising tantalum oxide, and the present invention is not limited to this configuration. For example, a configuration of a single layer comprising tantalum oxide is acceptable. Moreover, a single layer comprising a different transition metal such as hafnium (Hf) or zirconium (Zr) is also acceptable, as is a stacked structure comprising hafnium oxide or a stacked structure comprising zirconium oxide. This will be further discussed afterwards as configuration variations.

Moreover, the upper electrode 9 comprises, for example, one or a plurality of the following: gold (Au), platinum (Pt), iridium (Ir), palladium (Pd), silver (Ag), and copper (Cu), but is not limited thereto. These materials with respect to the upper electrode 9 are given as an example; other materials may be used.

As FIG. 1 shows, the memory device 100 according to the first embodiment is characterized by the lead-out line 12 serving as a bit line and being disposed so as to be in direct contact with the upper electrode 9, without the use of the conductive via 50a and such. With this configuration, a contact hole forming process (dry etching process) can be omitted at the time of forming the conductive via, which in conventional technology is used to connect the upper electrode 9 and the lead-out line 12. As a result, film thickness unevenness of the upper electrode 9 that occurs during contact hole formation is avoided, and fluctuation of the initial resistance value of the variable resistance element 10 that originates from the film thickness unevenness of the upper electrode is avoided.

Moreover, because a portion of the upper electrode 9 included in the variable resistance element 10 is configured to be in direct contact with the lead-out line 12 which is connected to the upper electrode 9, the contact area of the upper electrode 9 and the interlayer insulating layer 15 is decreased. As a result, the formation of a gap between the upper electrode 9 and the interlayer insulating layer 15 is markedly suppressed. Furthermore, because a conductive via connected to the upper electrode 9 is not formed, a contact shape malformation caused by the leaking of metal material (usually W) used to form the conductive via can be avoided.

Furthermore, when an electrical connection via a conductive via is used, the amount of current that can flow to the variable resistance element 10 is limited by the amount of current that can flow to the conductive via (which depends on the cross-sectional area of the conductive via and the electromigration property of the material used in the conductive via). However, with the configuration according to the first embodiment, the area of the portion of the upper electrode 9 and the lead-out line 12 that is electrically connected can be increased to the size of the area of the upper electrode 9. Therefore, supposing that a current with a current density comparable to when a conductive via is used can flow, one can deduce that an amount of current that can flow to the variable resistance element is sufficiently greater than in the conventional configuration.

Additionally, when a suitable material is selected for the lead-out line 12, a sufficiently great current can flow to the variable resistance element 10, and the degree of freedom can be increased with respect to the selection of material used in the variable resistance element 10 (in particular the variable resistance layer 8) and to the operation setting values of the variable resistance element 10 (and the memory device 100) Moreover, advantageously, a photomask which defines the conductive via connected to the upper electrode 9 is unnecessary in the manufacturing process.

[Method of Manufacturing the Memory Device]

Figure 2:
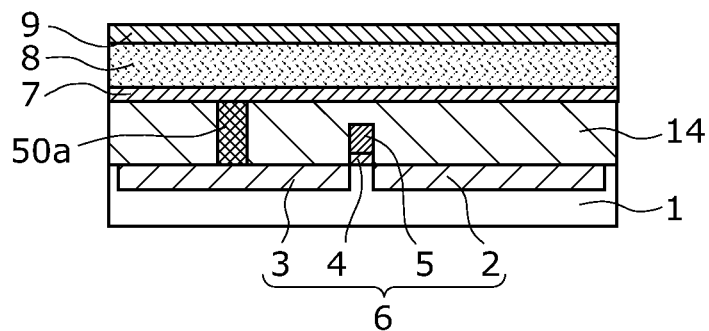
FIG. 2 is a process drawing showing an example of the method of manufacturing the memory device according to the first embodiment, including: (a) a drawing showing a process for stacking material for the lower electrode, the variable resistance layer, and the upper electrode above the first insulating layer; (b) a drawing showing a process for forming the variable resistance element on the first insulating layer; and (c) a drawing showing a process for forming the interlayer insulating layer to cover the variable resistance element.
Figure 2:
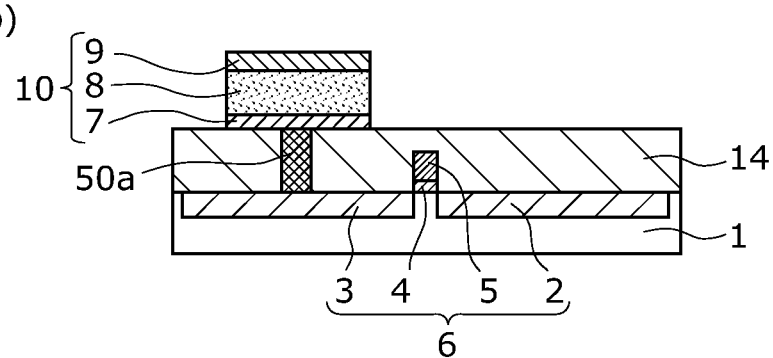
Figure 2:
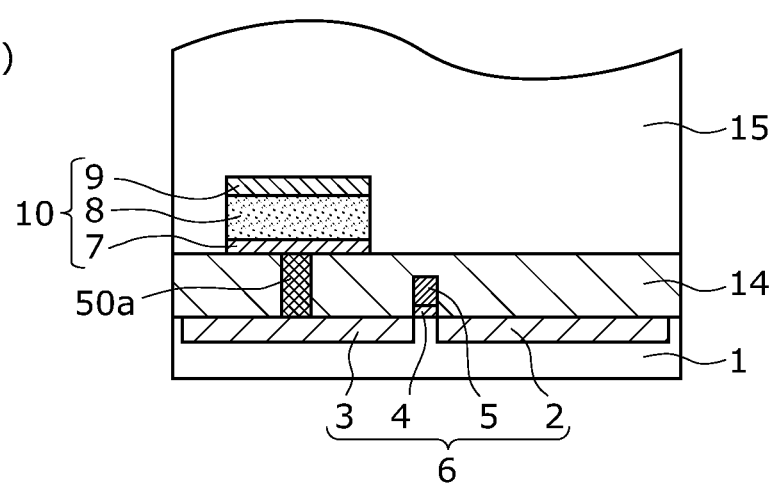
Figure 3:
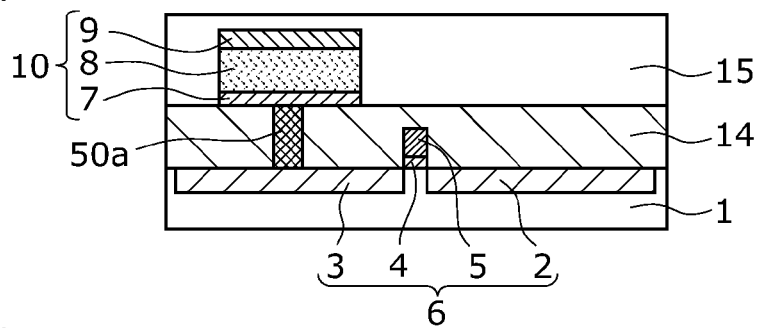
FIG. 3 is a process drawing showing an example of the method of manufacturing the memory device according to the first embodiment, including: (a) a drawing showing a process for planarizing the surface of the interlayer insulating layer; (b) a drawing showing a process for exposing the upper electrode included in the variable resistance element; (c) a drawing showing a process for forming the lead-out line which is in direct contact with the upper electrode included in the variable resistance element: and (d) a drawing showing a process for forming the metal line which is connected to the conductive via.
Figure 3:
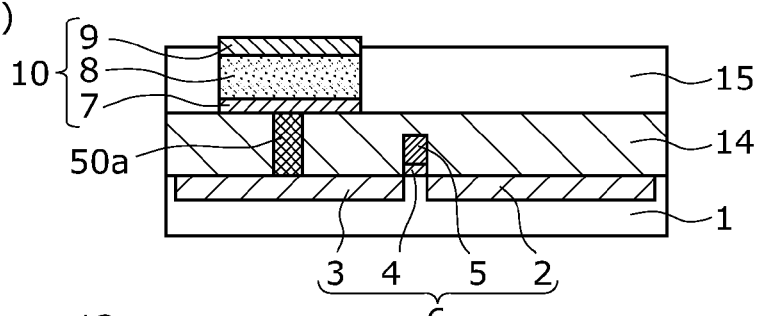
Figure 3:
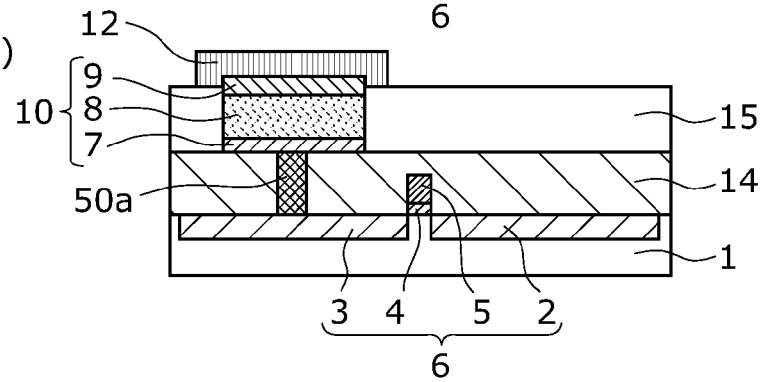
Figure 3:
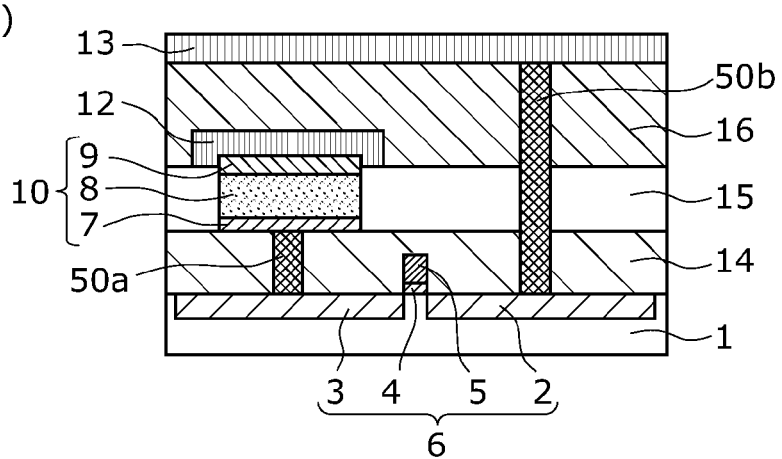

Next, the method of manufacturing the memory device 100 according to the first embodiment will be explained in order with respect to the process flow with reference to FIG. 2 and FIG. 3. FIG. 2 is a process drawing showing an example of the method of manufacturing the memory device according to the first embodiment, including: (a) a drawing showing a process for stacking material for the lower electrode, the variable resistance layer, and the upper electrode above the first insulating layer; (b) a drawing showing a process for forming the variable resistance element on the first insulating layer; and (c) a drawing showing a process for forming the interlayer insulating layer to cover the variable resistance element. FIG. 3 is a process drawing showing an example of the method of manufacturing the memory device according to the first embodiment, including: (a) a drawing showing a process for planarizing the surface of the interlayer insulating layer; (b) a drawing showing a process for exposing the upper electrode included in the variable resistance element; (c) a drawing showing a process for forming the lead-out line which is in direct contact with the upper electrode included in the variable resistance element: and (d) a drawing showing a process for forming the metal line which is connected to the conductive via.

It is to be noted that, as previously stated, a major difference between the first embodiment and a conventional structure is that the lead-out line 12 is in direct contact with the upper electrode 9 included in the variable resistance element 10. As such, the following description will detail the lead-out line 12 forming process and omit common manufacturing methods used in, for example, the select transistor 6 forming process, and silicon semiconductor manufacturing processes.

As shown in FIG. 2 (a), the substrate 1 having a semiconductor which includes the select transistor 6 fabricated therein is prepared. The outermost surface of the substrate 1 is covered by the insulating layer 14 comprising an insulating material such as a silicon oxide ($SiO_2$). The conductive via 50a is formed on the substrate 1 to electrically connect the lower electrode 7 included in the variable resistance element 10 with the drain region 3. The conductive via 50a is formed by first forming a contact hole in a predetermined region of the first insulating layer 14 which corresponds to the area where the lower electrode 7 included in the variable resistance element 10 is formed, then filling the contact hole with an electrically conductive material.

Next, as shown in FIG. 2 (a), the materials used to form the lower electrode 7, the variable resistance layer 8, and the upper electrode 9 are deposited in this order by sputtering. Subsequently, the lower electrode 7, the variable resistance layer 8, and the upper electrode 9 are processed together by dry etching, forming the variable resistance element 10 as shown in FIG. 2 (b). The upper electrode 9, for example, is formed using one or a plurality of the following: gold (Au), platinum (Pt), iridium (Ir), palladium (Pd), silver (Ag), and Rhodium (Rh). The variable resistance layer 8 is formed, for example, having a stacked structure and comprising: $TaO_x$ (where $0<x<2.5$) and $TaO_y$ (where $x<y$), $HfO_x$ (where $0<x<2.0$) and $HfO_y$ (where $x<y$), or $ZrO_x$ (where $0<x<2.0$) and $ZrO_y$ (where $x<y$). The lower electrode 7 has a stacked structure comprising a material which is electrically conductive. For example, the lower electrode 7 is formed from, in order from the layer in contact with the variable resistance layer 8, platinum (Pt), aluminum titanium nitride (TiAlN), and titanium nitride (TiN). It is to be noted that the material included in the lower electrode 7, the variable resistance layer 8, and the upper electrode 9 are not limited to the examples listed above. Moreover, the deposition method of the lower electrode 7, the variable resistance layer 8, and the upper electrode 9 is not limited to sputtering; chemical vapor deposition (CVD) or a different method is also acceptable.

Next, as shown in FIG. 2 (c), the interlayer insulating layer 15 comprising for example $SiO_2$ is deposited to cover the variable resistance element 10. Afterwards, as is shown in FIG. 3 (a), chemical-mechanical polishing (CMP) method is used for polishing and planarizing the surface of the interlayer insulating layer 15. In this process, it is preferable to control the amount of polish so as not to expose the variable resistance element 10 while planarizing the surface of the interlayer insulating layer 15. If the variable resistance element 10 becomes exposed while polishing the interlayer insulating layer 15, the shape of the variable resistance element 10 itself will become abnormal due to the polishing, or an abnormality with regard to the CMP equipment for insulation film such as $SiO_2$ will occur due to the polishing of a foreign material (the upper electrode 9 or variable resistance layer 8) in the equipment. The amount of polishing is controlled to avoid such circumstances. It is to be noted that planarizing the surface of the interlayer insulating layer 15 is also possible by what is called a resist etch-back method which includes coating the interlayer insulating layer 15 with photoresist and planarizing the surface, then, under a dry etching condition in which the etching speed of the resist and the etching speed of the interlayer insulating layer 15 are equal, etching in order from the surface, thereby definitively planarizing the surface of the interlayer insulating layer 15.

Next, as shown in FIG. 3(b), the interlayer insulating layer 15 is etched in order from the surface by what is called an etch-back method, and the etch-back process is stopped at the point in time the upper electrode 9 included in the variable resistance element 10 is exposed. As a result, only the upper electrode 9 included in the variable resistance element 10 is exposed to the outermost surface of the interlayer insulating layer 15. That is, apart from the region of the exposed the upper electrode 9, the entire outermost surface is comprised of an insulating material such as $SiO_2$.

Also, when the resist etch-back method is used for the planarization of the surface of the interlayer insulating layer 15, the etch-back process may be extended until the upper electrode 9 included in the variable resistance element 10 is exposed, whereupon the etch-back process is stopped. However, while the film thickness of the interlayer insulating layer 15 is usually approximately a few hundred nm to 1 micrometer (μm), the film thickness of the upper electrode 9 is comparatively thin at approximately a few dozen nm to 100 nm. It is therefore necessary when performing etch-back to expose the upper electrode 9 included in the variable resistance element 10 to select etching conditions (such as degree of vacuum, power, and type of gas) in which the etching amount can be finely controlled. This is because if the lower electrode 7 is exposed in the etch-back process, the upper electrode 9 and the lower electrode 7 will short circuit as a result of the formation of the lead-out line 12.

It is to be noted that, continuing the etch-back process until the upper electrode 9 is exposed means that the surface of the upper electrode 9 will also be etched in the etch-back process. However, because the etch-back process in this manufacturing process is low aspect ratio etching, a high density plasma and such for high aspect ratio etching such as dry etching of a fine contact hole is unnecessary, and is a relatively low power etching process. For this reason, film loss of the upper electrode 9 (particularly when the upper electrode 9 comprises a noble metal) from the etch-back process is negligibly small.

Afterwards, the material included in the lead-out line 12 such as aluminum (Al), is deposited by, for example, a sputtering method. As shown in FIG. 3 (c), this material is sputtered to form the lead-out line 12 which is in direct contact with the upper electrode 9 included in the variable resistance element 10. Next, the second insulating layer 16 comprising for example $SiO_2$ is formed on the interlayer insulating layer 15 to cover the lead-out line 12, and the surface of the second insulating layer 16 is planarized. Subsequently, the contact hole is formed in a predetermined region of the first insulating layer 14, the interlayer insulating layer 15, and the second insulating layer 16 which correspond to the area where in the source region 2 (or a different area) is formed. The conductive via 50b is then formed by filling the contact hole with an electrically conductive material such as W, for example. Furthermore, as shown in FIG. 3 (d), the memory device 100 is realized upon forming the metal line 13 on the second insulating layer 16.

It is possible to use an electrically conductive material such as Al for the lead-out line 12. Moreover, the lead-out line 12 may also have a stacked structure comprising a material which is electrically conductive. Specifically, when a material having a high electromigration hardness such as the transition metals chromium (Cr), molybdenum (Mo), niobium (Nb), tantalum (Ta), tungsten (W), titanium (Ti), vanadium (V), zirconium (Zr), or hafnium (Hf), the chemical compounds silicide, nitride, carbide, or boride is used for the portion of the lead-out line 12 in direct contact with the upper electrode 9 included in the variable resistance element 10, a sufficiently great current can flow to the variable resistance element 10, and the degree of freedom can be increased with respect to the selection of material used in the variable resistance element 10 and to the operation setting values of the variable resistance element 10 (and the memory device 100). Furthermore, depositing a layer comprising a transition metal such as those described above or a chemical compound such as silicide, nitride, carbide, or boride between the lead-out line 12 and the second insulating layer 16, and between the upper electrode 9 and the lead-out line 12 is advantageous in that the layer also functions as an adhesion layer.

Moreover, the metal line 13 may comprise the same electrically conductive material as the lead-out line 12 such as Al, and may also have a stacked structure comprising a material which is electrically conductive.

[Configuration of a Nonvolatile Memory Device]

FIG. 4 is a block diagram showing a configuration of a nonvolatile memory device 500 according to the first embodiment.

As shown in FIG. 4, the nonvolatile memory device 500 is includes a memory main body 201 on a substrate having a semiconductor. The memory main body 201 includes a memory cell array 202 having a plurality of 1T1R memory cells arranged in a matrix, a row selection circuit 208, a row driver 207 including word line drivers WLD and source line drivers SLD, a column selection circuit 203, a write circuit 206 for writing information, a sense amplifier 204 which detects an amount of current flowing in a selected bit line and determines whether the data indicates "1" or "0", and a data input and output circuit 205 which performs an input and output process of input and output data via a DQ terminal. It is to be noted that the plurality of 1T1R memory cells included in the memory cell array 202 and arranged in a matrix use the memory device 100 described in FIG. 1.

Moreover, when the memory cell array 202 uses the variable resistance element 10 having a stacked structure including two types of oxygen-deficient variable resistance layers (a high-concentration oxide layer and a low-concentration oxide layer), four different configurations with respect to the relative position of the variable resistance element 10 and the transistor (which one is connected to the bit line) and the arrangement of the source line (parallel to the bit line or to the word line) can be employed, and are explained in (1) through (4) below. Below, the nonvolatile memory device having a 1T1R memory cell array according to (2) is used in the explanation with reference to FIG. 4, but explanation of the configurations of the 1T1R memory cell array according to (1), (2), (3), or (4) is possible all the same.

(1) The bit line is connected to the high-concentration oxide layer included in the variable resistance element 10, the source line is connected to the transistor 6, and the source line is arranged to be parallel to the bit line.

(2) The bit line is connected to the high-concentration oxide layer included in the variable resistance element 10, the source line is connected to the transistor 6, and the source line is arranged to be parallel to the word line.

(3) The source line is connected to the high-concentration oxide layer included in the variable resistance element 10, the bit line is connected to the transistor 6, and the source line is arranged to be parallel to the bit line.

(4) The source line is connected to the high-concentration oxide layer included in the variable resistance element 10, the bit line is connected to the transistor 6, and the source line is arranged to be parallel to the word line.

The nonvolatile memory device 500 in FIG. 4 includes, as a write power source 211, a power source for low resistance (LR) writing 212 (hereinafter referred to as LR power source 212) and a power source for high resistance (HR) writing 213 (hereinafter referred to as HR power source 213). Here, LR writing refers to changing the resistance state of the variable resistance element from a high resistance state to a low resistance state, and HR writing refers to changing the resistance state of the variable resistance element from a low resistance state to a high resistance state. An output V2 of the LR power source 212 is supplied to the row driver 207, and an output V1 of the HR power source 213 is supplied to the write circuit 206.

Furthermore, the nonvolatile memory device 500 includes an address input circuit 209 which receives an address signal input from an external source, and a control circuit 210 which controls operation of the memory main body 201 based on a control signal input from an external source.

The memory cell array 202 includes, formed above the substrate having a semiconductor: a plurality of word lines WL0, WL1, WL2 . . . and bit lines BL0, BL1, BL2 . . . arranged in an array and crossing each other; source lines SL0, SL2 . . . deposited between the word lines WL0, WL1, WL2 . . . ; a plurality of NMOS transistors N11, N12, N13, N21, N22, N23, N31, N32, N33 . . . (hereinafter referred to as transistors N11, N12 . . . ) each deposited to a corresponding crosspoint of the word lines WL0, WL1, WL2 . . . and bit lines BL0, BL1, BL2 . . . ; and a plurality of variable resistance elements R11, R12, R13, R21, R22, R23, R31, R32, R33 . . . (hereinafter referred to as variable resistance elements R11, R12 . . . ) connected in serial in a one-to-one relationship with the transistors N11, N12 . . . . The word lines, source lines, bit lines, NMOS transistors, and variable resistance element included in the memory cell array 202 are arranged in two dimensions, that is, lateral and longitudinal directions as is shown in FIG. 4, but only a portion of the memory cell array 202 is depicted in FIG. 4 for ease of explanation. A plurality of 1T1R memory cells M11, M12, M13, M21, M22, M23, M31, M32, M33 . . . (hereinafter referred to as memory cells M11, M12 . . . ) are arranged in a matrix, and each of the memory cells M11, M12 . . . is configured from a corresponding one of the word lines WL0, WL1, WL2 . . . , a corresponding one of the bit lines BL0, BL1, BL2 . . . , a corresponding one of the source lines SL0, SL2 . . . , a corresponding one of the transistors N11, N12 . . . , and a corresponding one of the variable resistance elements R11, R12 . . . .

As shown in FIG. 4, gates of the transistors N11, N21, N31 . . . are connected to the word line WL0, gates of the transistors N12, N22, N32 . . . are connected to the word line WL1, and gates of the transistors N13, N23, N33 . . . are connected to the word line WL2. Furthermore, the transistors N11, N21, N31 . . . and the transistors N12, N22, N32 . . . are connected in common to the source line SL0, and the transistors N13, N23, N33 . . . and the transistors N14, N24, N34 . . . are connected in common to the source line SL2.

Moreover, one terminal of each of the variable resistance elements R11, R12, R13 . . . is connected to the bit line BL0, and the other terminal of each of the variable resistance elements R21, R22, R23 . . . is connected to the bit line BL1. In the same manner, one terminal of each of the variable resistance elements R31, R32, R33 . . . is connected to the bit line BL2.

The address input circuit 209 receives an address signal from an external circuit (not shown in the drawings), and, based on this address signal, simultaneously outputs a row address signal to the row selection circuit 208 and a column address to the column selection circuit 203. Here, the address signal is a signal indicating an address of a specific memory cell to be selected from among the plurality of memory cells M11, M12 . . . . Moreover, the row address signal is a signal indicating an address of a row which is part of the address indicated by the address signal, and the column address is a signal which is part of the address indicated by the address signal.

In a data write cycle, the control circuit 210 outputs, to the write circuit 206, a write command signal instructing application of a voltage for writing, according to input data Din input into the data input and output circuit 205. On the other hand, in a data read cycle, the control circuit 210 outputs, to the sense amplifier 204, a read command signal instructing a read operation.

The row selection circuit 208 receives the row address signal output from the address input circuit 209, and selects one of the word lines WL0, WL1, WL2 . . . according to the row address signal. The row driver 207 applies a predetermined voltage to the word line selected by the row selection circuit 208, based on an output signal of the row selection circuit 208.

Similarly, the row selection circuit 208 receives the row address signal output from the address input circuit 209, and selects one of the source lines SL0, SL2 . . . according to the row address signal. The row driver 207 applies a predetermined voltage to the source line selected by the row selection circuit 208, based on an output signal of the row selection circuit 208. Furthermore, the column selection circuit 203 receives the column address signal output from the address input circuit 209, selects one of the bit lines BL0, BL1, BL2 . . . according to the column address signal, and applies a voltage for writing or a voltage for reading to the selected bit line.

The write circuit 206 outputs, to the column selection circuit 203, a signal instructing the application of the voltage for writing to the selected bit line when the write circuit 206 receives the write command signal output from the control circuit 210. Moreover, in the data read cycle, the sense amplifier 204 detects an amount of current flowing in the selected bit line to be read, and determines whether the data indicates "1" or "0". The resultant output data DO is output to the external circuit via the data input and output circuit 205.

Figure 5:
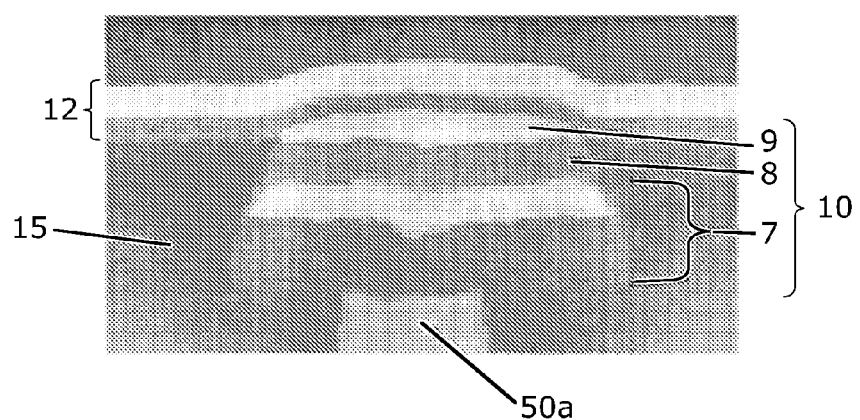
FIG. 5 is a cross-sectional SEM photograph of a variable resistance element experimentally manufactured using the method of manufacturing the memory device according to the first embodiment.

FIG. 5 is a cross-sectional SEM photograph of the variable resistance element 10 experimentally manufactured using the method of manufacturing the memory device 100 according to the first embodiment. As shown in FIG. 5, the variable resistance element 10 includes the lower electrode 7, the variable resistance layer 8, and the upper electrode 9.

The lower electrode 7 has a stacked structure comprising a material which is electrically conductive. Specifically, the lower electrode 7 has a stacked structure comprising, in order from the layer in contact with the variable resistance layer 8, platinum (Pt), aluminum titanium nitride (TiAlN), and titanium nitride (TiN). It is to be noted that, according to the first embodiment, the lower electrode 7 is not limited to this stacked structure.

Moreover, in FIG. 5, the lead-out line 12 also has a stacked structure comprising Pt and TiAlN. Specifically, the layer which is in direct contact with the upper electrode 9 comprises TiAlN. The lead-out line 12 is also not limited to this stacked structure, and may be a single layer comprising an electrically conductive material such as Al as previously stated, or have a stacked structure comprising a material which is electrically conductive. Specifically, when a material having a high electromigration hardness such as the transition metals chromium (Cr), molybdenum (Mo), niobium (Nb), tantalum (Ta), tungsten (W), titanium (Ti), vanadium (V), zirconium (Zr), or hafnium (Hf), the chemical compounds silicide, nitride, carbide, or boride is used for the portion of the lead-out line 12 in direct contact with the upper electrode 9 included in the variable resistance element 10, a sufficiently great current can flow to the variable resistance element 10. Accordingly, the degree of freedom can be increased with respect to the selection of material used in the variable resistance element 10 and to the operation setting values of the variable resistance element 10 (and the memory device 100).

Furthermore, as is shown in FIG. 5, the lead-out line 12 is in direct contact with and completely covers the upper electrode 9 included in the variable resistance element 10, and a gap is not formed between the lead-out line 12 or the interlayer insulating layer 15 (interlayer insulating film) and, for example as is used in FIG. 5, silicon oxide ($SiO_2$). This indicates that the layer (TiAlN) included in the lead-out line 12 having a stacked structure and in direct contact with the interlayer insulating layer 15 and the upper electrode 9 included in the variable resistance element 10 functions as an adhesion layer.

As is shown in FIG. 5, when the area of the portion of the upper electrode 9, which is included in the variable resistance element 10, and the lead-out line 12 that is electrically connected is approximately equal to the area of the upper electrode 9, as previously stated, an amount of current can flow to the variable resistance element 10 that is sufficiently greater than in a conventional configuration (when a conductive via is used). Accordingly, the degree of freedom can be increased with respect to the selection of material used in the variable resistance element 10 and to the operation setting values of the variable resistance element 10 (and the memory device 100). Moreover, because a photomask which defines the conductive via connected to the upper electrode 9 is unnecessary, manufacturing costs and the number of manufacturing processes can be reduced.

It is to be noted that, while a small amount of film thickness unevenness of the upper electrode 9 can be seen in FIG. 5, this unevenness forms when the variable resistance element 10 is formed by dry etching (see FIG. 2 (b)). With the proper dry etching process conditions, film thickness unevenness of the upper electrode 9 can be further reduced.

With the memory device 100 according to the first embodiment as described above, the physical connection shape (contact shape) between the electrically connected the lead-out line 12 and the upper electrode 9 included in the variable resistance element 10 can be improved, and film thickness unevenness of the upper electrode 9 can be reduced. In other words, in the memory device according to the first embodiment, because a conductive via does not need to be placed between the upper electrode 9 and the lead-out line 12, the shape abnormality formed at the interface between the upper electrode 9 and the conductive via, as well as the film thickness unevenness of the upper electrode 9 as a result of over etching at the time the contact hole is formed in order to form the conductive via can be reduced. As a result, it is possible to provide the memory device 100 having the variable resistance element 10 in which initial resistance value fluctuations are suppressed.

(Second embodiment)

[Configuration of the Memory Device]

A memory device 200 according to the second embodiment is different from the memory device 100 according to the first embodiment in that the metal line 17 which is not connected to the upper electrode 9, is formed at the same time as the lead-out line 12. Other configurations are the same as the memory device 100 according to the first embodiment, and as such, descriptions thereof will be omitted.

Figure 6:
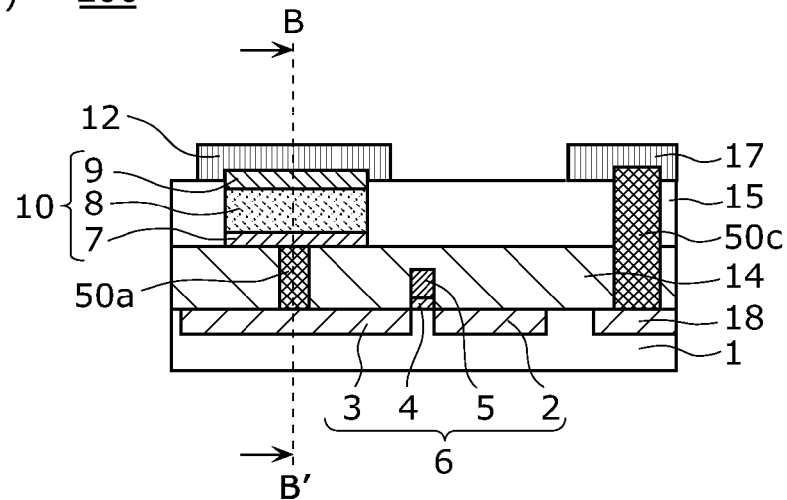
FIG. 6 is a diagrammatic view of a memory device according to the second embodiment, including: (a) a cross-sectional view showing a configuration of the memory device; (b) a cross-sectional view as viewed from the direction of the arrow along the line B-B' shown in (a); and (c) a plain view as viewed from the surface of (a).
Figure 6:
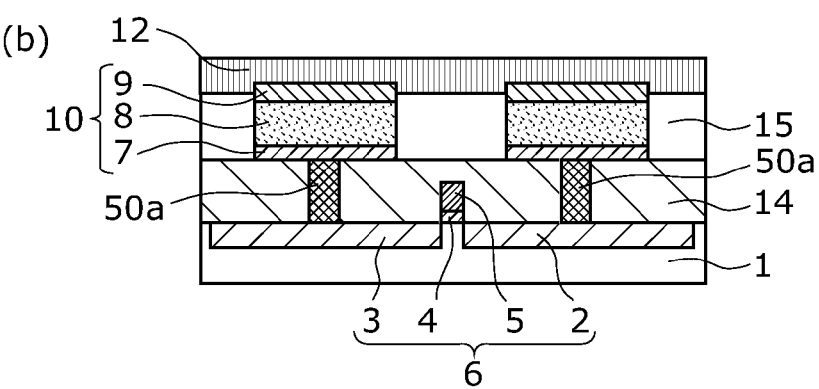
Figure 6:
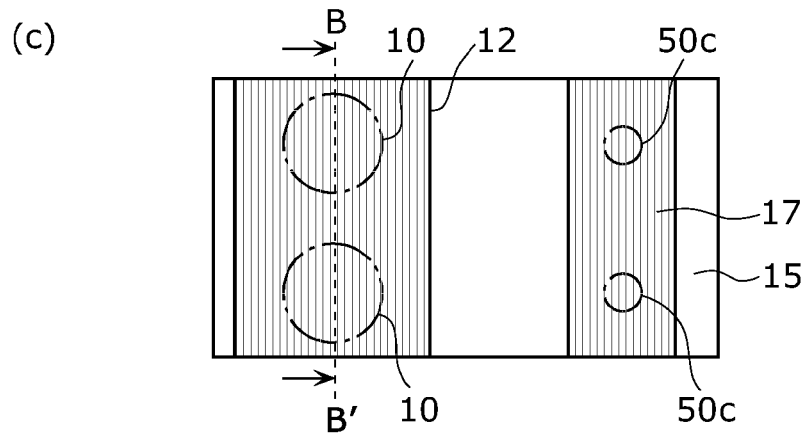

FIG. 6 is a diagrammatic view of the memory device 200 according to the second embodiment. FIG. 6 (a) is a cross-sectional view showing a configuration of the memory device, FIG. 6 (b) is a cross-sectional view as viewed from the direction of the arrow along the line B-B' shown in FIG. 6 (a), and FIG. 6 (c) is a plain view as viewed from the surface of FIG. 6 (a). It is to be noted that in FIG. 6 (c), a number of constituents of the memory device which cannot be seen from the surface are shown with dashed lines and labeled with reference numerals. The reference numerals used in FIG. 6 are the same as those used for the constituents in FIG. 1 through FIG. 3, and as such, descriptions thereof will be omitted.

The memory device 200 is provided with a plurality of 1T1R memory cells. Specifically, as shown in FIG. 6 (a), each of the memory cells is formed from the select transistor 6 and the variable resistance element 10 connected in serial via the conductive via 50a. The select transistor 6 includes, manufactured above a substrate 1 having a semiconductor, the source region 2, the drain region 3, the gate oxide film 4, and the gate electrode 5 formed on the gate oxide film 4.

According to the second embodiment, the variable resistance element 10 has a cylindrical shape. In other words, the variable resistance element 10 has a cylindrical shape when viewed from above, as is shown in FIG. 6 (c). It should be noted that the variable resistance element 10 is not limited to this shape, and may be formed into a rectangular-parallelepiped-shape, for example (in this case, the variable resistance element will have a tetragonal shape when viewed from above like in FIG. 6 (c)).

The variable resistance element 10 includes the variable resistance layer 8 which is disposed between the lower electrode 7 and the upper electrode 9 and whose resistance value changes in response to an applied voltage. Here, the lower electrode 7 and the drain region 3 are electrically connected via the conductive via 50a. Moreover, the gate electrode 5 is connected to a word line (not shown in the drawings).

Additionally, the interlayer insulating layer 15 is deposited in the vicinity of the variable resistance element 10. A lead-out line 12 including a noble metal is deposited on the upper portion of the upper electrode 9 included in the variable resistance element 10 so as to cover the upper electrode 9. As shown in FIG. 6 (b), the lead-out line 12 is provided in common to a plurality of the memory cells.

Furthermore, as shown in FIG. 6 (a), the metal line 17 is deposited on the interlayer insulating layer 15 in the area above a diffusion layer 18. The diffusion layer 18 is connected to the metal line 17 via a conductive via 50c. As shown in FIG. 6 (c), the metal line 17 is provided in common to a plurality of the memory cells. The gate electrode 5 of the select transistor 6 included in the memory cell is connected to the word line (not shown in the drawings), and the upper electrode 9 included in the variable resistance element 10 or one of the diffusion layer 18 of the transistor (for example, the source region 2) is connected to a bit line (not shown in the drawings). As shown in FIG. 4, the word lines and the bit lines are disposed so as to cross each other. A plurality of the memory cells are disposed in an array in the direction of the word lines and the bit lines, forming a memory cell array. In other words, in the variable resistance element 10 according to the first embodiment, the second insulating layer 16 comprising for example $SiO_2$ is formed above the lead-out line 12 and the interlayer insulating layer 15, and the metal line 13 is further formed above the second insulating layer 16, but in the variable resistance element 10 according to the second embodiment, the lead-out line 12 and the metal line 17 are both formed above the interlayer insulating layer 15 at the same time and deposited in the same plane.

With the above configuration, it is possible for the memory device 200 according to the second embodiment to have fewer metal line layers than the first embodiment.

[Method of Manufacturing the Memory Device]

Figure 7:
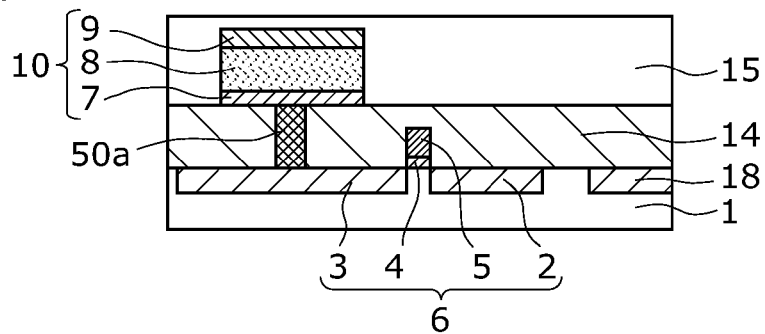
FIG. 7 is a process drawing showing an example of the method of manufacturing the memory device according to the second embodiment, including: (a) a drawing showing a process for planarizing the surface of the interlayer insulating layer; (b) a drawing showing a process for forming the conductive via which is connected to the metal line; (c) a drawing showing a process for exposing the upper electrode included in the variable resistance element; and (d) a drawing showing a process for forming the metal line which is connected to the conductive via at the same time as an electrode line which is in direct contact with the upper electrode.
Figure 7:
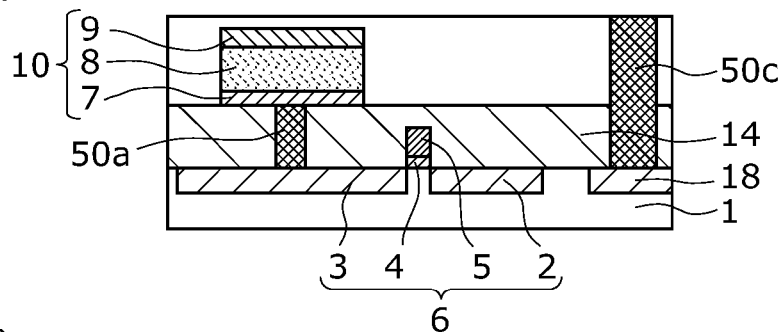
Figure 7:
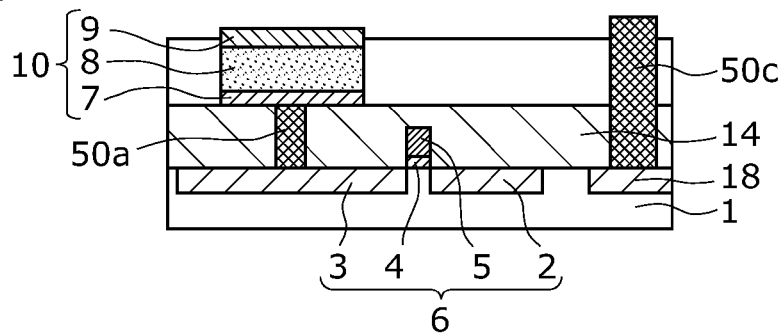
Figure 7:
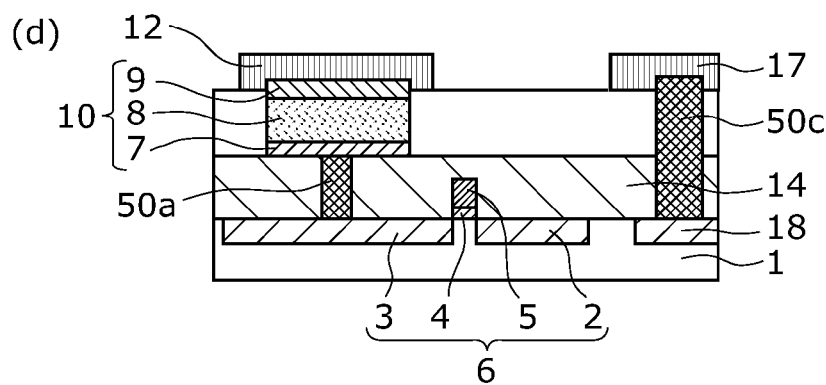

Next, the method of manufacturing the memory device 200 according to the second embodiment will be explained in order with respect to the process flow with reference to FIG. 7. FIG. 7 is a process drawing showing an example of the method of manufacturing the memory device according to the second embodiment, including: (a) a drawing showing a process for planarizing the surface of the interlayer insulating layer; (b) a drawing showing a process for forming the conductive via which is connected to the metal line; (c) a drawing showing a process for exposing the upper electrode included in the variable resistance element; and (d) a drawing showing a process for forming the metal line which is connected to the conductive via at the same time as the electrode line which is in direct contact with the upper electrode. It is to be noted that, the process flow of the second embodiment is the same as the first embodiment up until the planarization of the surface of the interlayer insulating layer 15 which exposes the variable resistance element 10 (corresponding to FIG. 3 (*a*)), and as such, those descriptions will be omitted, and the process flow thereafter will be explained.

As shown in FIG. 7 (*a*), after planarizing the interlayer insulating layer 15 exposing the variable resistance element 10, the conductive via 50*c* for connecting the diffusion layer 18 and the metal line 17 is formed. Here, the conductive via 50*c* is formed for connecting the diffusion layer 18 as an example, but it may be a conductive via for connecting a different layer.

As shown in FIG. 7 (*b*), first a contact hole is formed for the conductive via 50*c* by dry etching. Afterwards, the contact hole is filled with tungsten (W) by CVD. Next, the surface of the W is removed by CMP, forming the conductive via 50*c* filled with W.

Next, as shown in FIG. 7 (*c*), the interlayer insulating layer 15 is etched in order from the surface by what is called an etch-back method, and the etch-back process is stopped at the point in time the upper electrode 9 included in the variable resistance element 10 is exposed. As a result, the upper electrode 9, which is included in the variable resistance element 10, and the conductive via 50*c* are exposed to the outermost surface of the interlayer insulating layer 15. Apart from the region of the exposed the upper electrode 9 and the conductive via 50*c*, the entire outermost surface is comprised of an insulating material such as $SiO_2$.

Also, when the resist etch-back method is used for the planarization of the surface of the interlayer insulating layer 15, the etch-back process may be extended until the upper electrode 9 included in the variable resistance element 10 is exposed, whereupon the etch-back process is stopped. However, while the film thickness of the interlayer insulating layer 15 is usually approximately a few hundred nm to 1 micrometer (μm), the film thickness of the upper electrode 9 is comparatively thin at approximately a few dozen nm to 100 nm. It is therefore necessary when performing etch-back to expose the upper electrode 9 included in the variable resistance element 10 to select etching conditions (such as degree of vacuum, power, and type of gas) by which the etching amount can be finely controlled. If the lower electrode 7 is exposed in the etch-back process, the upper electrode 9 and the lower electrode 7 will short circuit as a result of the formation of the lead-out line 12.

It is to be noted that, continuing the etch-back process until the upper electrode 9 is exposed means that the surface of the upper electrode 9 will also be etched in the etch-back process. However, because the etch-back process in this manufacturing process is low aspect ratio etching, a high density plasma and such for high aspect ratio etching such as dry etching of a fine contact hole is unnecessary, and is a relatively low power etching process. For this reason, film loss of the upper electrode 9 (particularly when the upper electrode 9 comprises a noble metal) from the etch-back process is negligibly small.

Afterwards, the material included in the lead-out line 12 and the metal line 17 such as Al is deposited by, for example, a sputtering method. By sputtering this material to simultaneously form, as is shown in FIG. 7 (*d*), the lead-out line 12 which is in direct contact with the upper electrode 9 included in the variable resistance element 10, and the metal line 17 which is connected to the conductive via 50*c*, the memory device 200 can be realized.

In the second embodiment, the upper electrode 9 comprises, but is not limited to, for example, one or a combination of the materials: Au, Pt, Ir, Pd, Ag, and Cu; the variable resistance layer 8 is formed, for example, having a stacked structure and comprising, but not limited to, for example: $TaO_x$ (where $0<x<2.5$) and $TaO_y$ (where $x<y$), $HfO_x$ (where $0<x<2.0$) and $HfO_y$ (where $x<y$), or $ZrO_x$ (where $0<x<2.0$) and $ZrO_y$ (where $x<y$). Moreover, the deposition method of the lower electrode 7, the variable resistance layer 8, and the upper electrode 9 is not limited to sputtering; CVD or a different method is also acceptable.

It is possible to use an electrically conductive material such as Al for the lead-out line 12 and the metal line 17. Moreover, the lead-out line 12 and the metal line 17 may also have a stacked structure comprising a material which is electrically conductive. Specifically, when a material having a high electromigration hardness such as the transition metals Cr, Mo, Nb, Ta, W, Ti, V, Zr, or Hf, the chemical compounds silicide, nitride, carbide, or boride is used for the portion of the lead-out line 12 in direct contact with the upper electrode 9 included in the variable resistance element 10, a sufficiently great current can flow to the variable resistance element 10, and the degree of freedom can be increased with respect to the selection of material used in the variable resistance element 10 and to the operation setting values of the variable resistance element 10 (and the memory device 200) Furthermore, the layer of the lead-out line comprising a transition metal such as those described above or a chemical compound such as silicide, nitride, carbide, or boride is provided to interface with the second insulating layer 16 or the upper electrode 9 and thereby advantageously functions as an adhesion layer.

By using a plurality of 1T1R memory cells configured in a memory cell array and arranged in a matrix, the memory device 200 according to the second embodiment formed as described above can be configured as a nonvolatile memory device in the same manner as the nonvolatile memory device 500 according to the first embodiment previously described, and can function successfully in the same manner as the first embodiment.

(Third embodiment)

[Configuration of the Memory Device]

A memory device 300 according to the third embodiment is different from the memory device 100 according to the first embodiment in that the lead-out line 12 is in contact with the variable resistance layer 8 in addition to the upper electrode 9 which are included in the variable resistance element 10. Other configurations are the same as the memory device 100 according to the first embodiment, and as such, descriptions thereof will be omitted.

Figure 8:
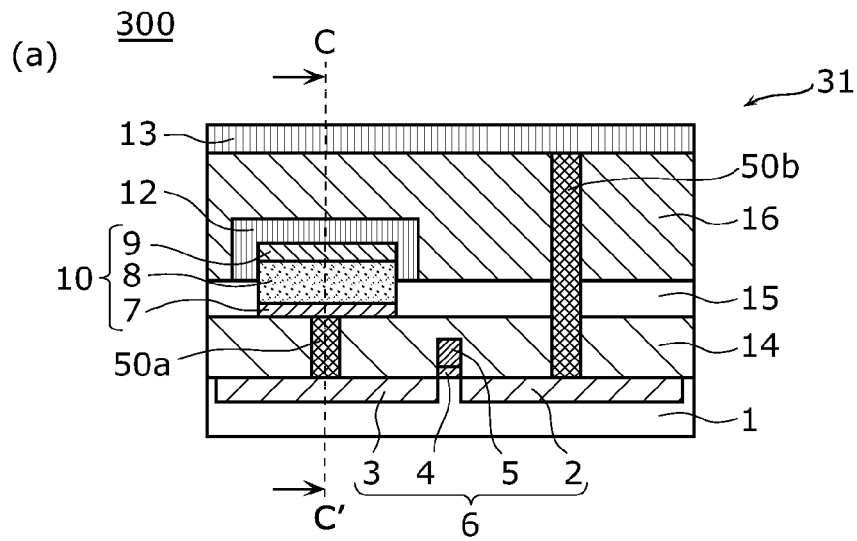
FIG. 8 is a diagrammatic view of a memory device according to the third embodiment including: (a) a cross-sectional view showing a configuration of the memory device; and (b) a cross-sectional view as viewed from the direction of the arrow along the line C-C' shown in (a).
Figure 8:
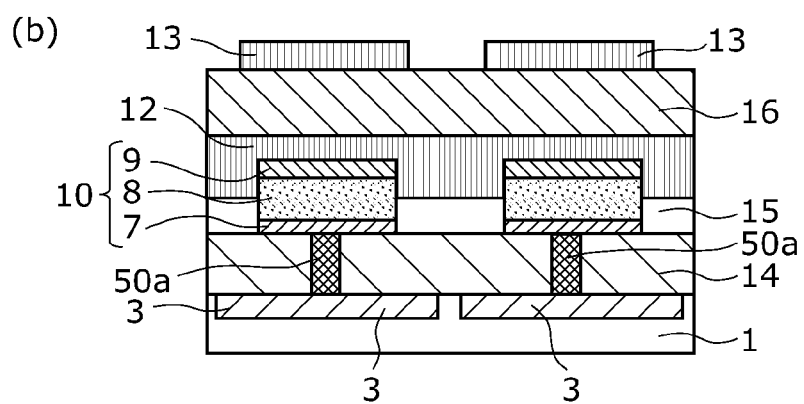

FIG. 8 is a diagrammatic view of the memory device according to the third embodiment. FIG. 8 (*a*) is a cross-sectional view of the memory device 300. FIG. 8 (*b*) is a cross-sectional view as viewed from the direction of the arrow along the line C-C' shown in FIG. 8 (*a*). The reference numerals used in FIG. 8 (*a*) are the same as those used for the constituents in FIG. 1 through FIG. 3, and as such, descriptions thereof will be omitted.

The memory device 300 is provided with a plurality of 1T1R memory cells. Specifically, as shown in FIG. 8 (*a*), each of the memory cells is formed from the select transistor 6 and the variable resistance element 10 connected in serial via the conductive via 50a. The select transistor 6 includes, manufactured above a substrate 1 having a semiconductor, the source region 2, the drain region 3, the gate oxide film 4, and the gate electrode 5 formed on the gate oxide film 4.

The variable resistance element 10 includes the variable resistance layer 8 which is disposed between the lower electrode 7 and the upper electrode 9 and whose resistance value changes in response to an applied voltage. Here, the lower electrode 7 and the drain region 3 are electrically connected via the conductive via 50a. Moreover, the gate electrode 5 is connected to a word line (not shown in the drawings).

Additionally, the interlayer insulating layer 15 is deposited in the vicinity of the variable resistance element 10. The lead-out line 12 is deposited on the upper portion of the upper electrode 9 included in the variable resistance element 10 so as to cover the upper electrode 9. As shown in FIG. 8 (*b*), the lead-out line 12 is provided in common to a plurality of the memory cells. Moreover, the bottommost surface of the bottom surfaces of the lead-out line 12 is formed to be lower than the top surface of the upper electrode 9. In other words, the lead-out line 12 is formed to cover the entire surface and the walls of the upper electrode 9 as well as a portion of the side walls of the variable resistance layer 8, and furthermore is formed on the interlayer insulating layer 15 within a predetermined range from the variable resistance element 10. It is to be noted that the lead-out line 12 may also be formed to cover a portion of the upper electrode 9 and a portion of the side walls of the upper electrode 9 and the variable resistance layer 8, and not the entire top surface of the upper electrode 9, and may be formed on a portion of the interlayer insulating layer 15 within a predetermined range from the upper electrode 9.

Furthermore, the second insulating layer 16 comprising for example $SiO_2$ is disposed on the lead-out line 12 and the interlayer insulating layer 15. The metal line 13 is disposed on the second insulating layer 16. The metal line 13 is provided in common to a plurality of the memory cells. The source region 2 included in the select transistor 6 is connected, via a conductive via 50b, to the diffusion layer serving as a source line, or the metal line 13. The gate electrode 5 of the select transistor 6 included in the memory cell is connected to the word line (not shown in the drawings), and the upper electrode 9 included in the variable resistance element 10 or one portion of the diffusion layer 18 of the transistor (for example, the source region 2) is connected to a bit line (not shown in the drawings). As shown in FIG. 4, the word lines and the bit lines are disposed so as to cross each other. The memory cells are disposed in an array in the direction of the word lines and the bit lines, forming a memory cell array.

With the above configuration, there is an advantage in which the etch-back margin can be increased in the forming process of the lead-out line 12, that is, the etch-back process which exposes the upper electrode 9.

[Method of Manufacturing the Memory Device]

The method of manufacturing the memory device 300 according to the third embodiment that differs from the method of manufacturing the memory device 100 according to the first embodiment in that it includes a manufacturing process in which the interlayer insulating layer 15 is etched in order from the surface by what is called an etch-back method, and the etch-back process is stopped at the point in time at least a portion of the upper electrode 9 and the variable resistance layer 8 included in the variable resistance element 10 are exposed.

Figure 9:
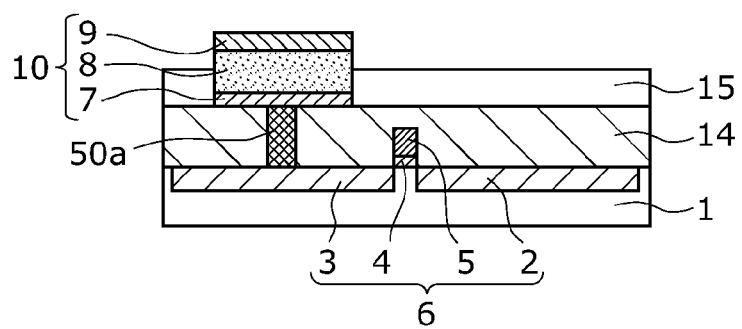
FIG. 9 is a process drawing showing an example of the method of manufacturing the memory device according to the third embodiment in which the process of exposing the variable resistance layer and the upper electrode included in the variable resistance element is shown.
Figure 10:
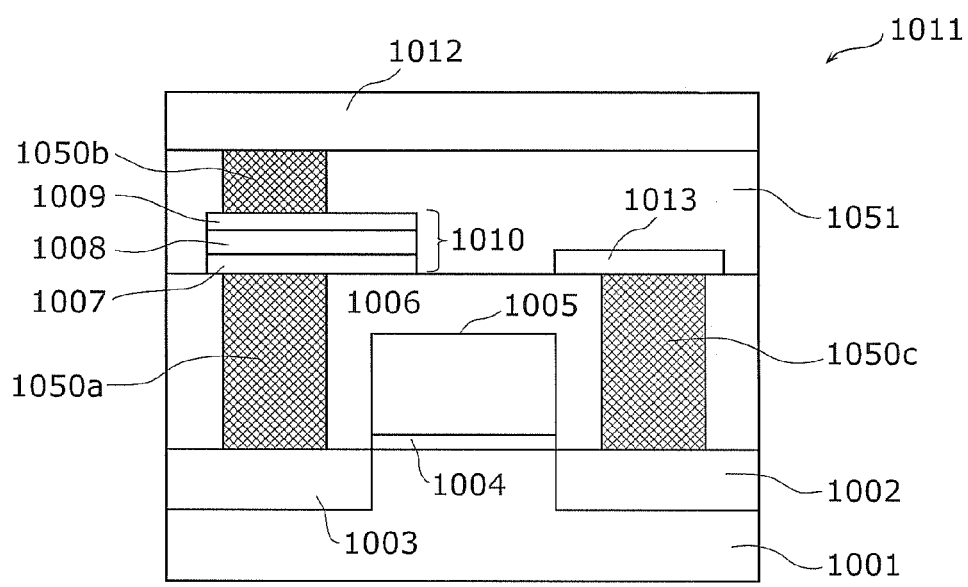
FIG. 10 is a diagrammatic cross-sectional view showing a configuration of a memory cell included in a conventional memory device.
Figure 11:
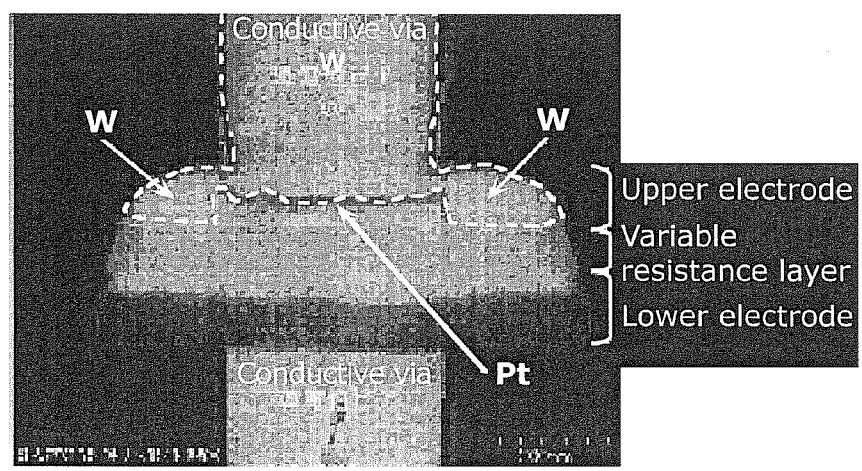
FIG. 11 is a cross-sectional SEM photograph of a variable resistance element experimentally manufactured using Pt in the upper electrode and $SiO_2$ in the insulating layer.
Figure 12:
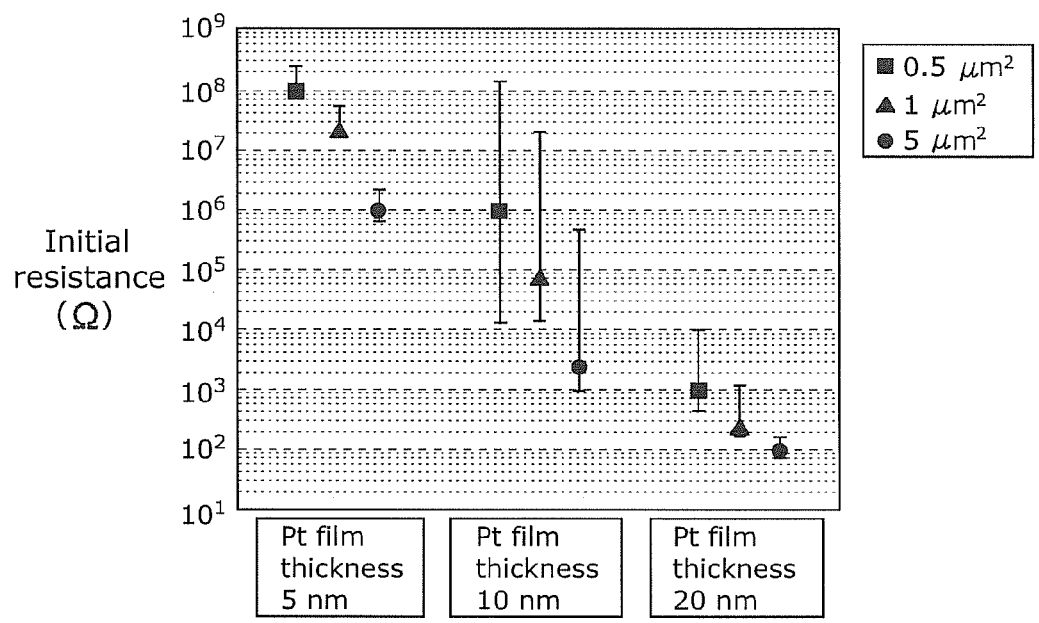
FIG. 12 is a graph showing initial resistance values of a variable resistance element including an upper electrode comprising Pt, a variable resistance layer comprising $TaO_x$, and a lower electrode comprising tantalum nitride (TaN) when the film thickness of the Pt included in the upper electrode is 5 nm, 10 nm, and 20 nm.
Figure 13:
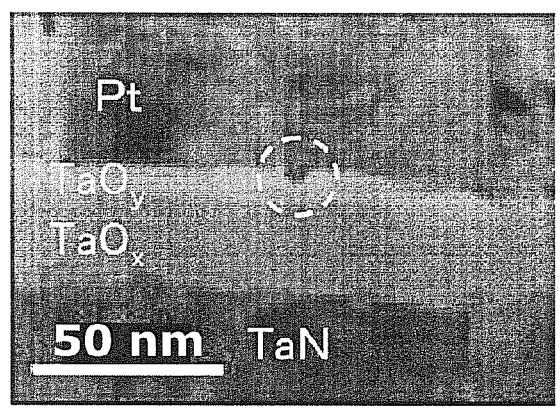
FIG. 13 is a cross-sectional TEM photograph of the variable resistance element including Pt in the upper electrode and $TaO_x$ in the variable resistance layer.

FIG. 9 is a process drawing showing an example of the method of manufacturing the memory device according to the third embodiment in which the process of exposing the variable resistance layer and the upper electrode included in the variable resistance element is shown (a cross-sectional diagrammatic view after completion of the etch-back process). Especially when the variable resistance layer 8 comprises an oxide such as $TaO_x$ (where $0<x<2.5$), $HfO_x$ (where $0<x<2.0$) and $HfO_y$, or $ZrO_x$ (where $0<x<2.0$), the portion of the variable resistance layer 8 in contact with the interlayer insulating layer 15 comprising for example $SiO_2$ is strongly oxidized to a further degree in the process depositing the interlayer insulating layer 15 to cover the variable resistance element 10 (in the first embodiment, corresponding to FIG. 2 (*c*)), whereby the resistance is increased (the variable resistance layer becomes insulative). For this reason, even if the variable resistance layer 8 is exposed in the etch-back process and brought into contact with the lead-out line 12, current will not flow from the portion in contact. Current flows to or from the lead-out line 12 via the upper electrode 9 only. Consequently, an electrical characteristic of the variable resistance element 10 is basically the same as that of the first embodiment.

From the viewpoint of the manufacturing method, in the etch-back process of the interlayer insulating layer 15, with the third embodiment, the electrical characteristic will not change even if the variable resistance element 10 is exposed to the variable resistance layer 8, unlike with the first embodiment in which only the upper electrode 9 included in the variable resistance element 10 is to be exposed. That is, the memory cell array may contain a mixture of the memory cells according to the first embodiment (FIG. 1) and the memory cells according to the third embodiment (FIG. 8). For this reason, using the third embodiment is advantageous in that the etch-back margin can be increased.

By using a plurality of 1T1R memory cells formed in a memory cell array and arranged in a matrix, the memory device 300 according to the third embodiment formed as described above can be configured as a nonvolatile memory device 500 in the same manner as the memory device 100 according to the first embodiment previously described, and can function successfully in the same manner as the first embodiment.

(Configuration Variations of the First Through Third Embodiments)

In each of the above embodiments, the transition metal oxide layer which forms the variable resistance layer is described as having a stacked structure comprising a tantalum oxide, but achievement of the functionality of the present invention as described above, as well as the present invention itself, is not limited to the use of tantalum oxide. A stacked structure comprising a hafnium (Hf) oxide or a stacked structure comprising a zirconium (Zr) oxide is also acceptable. Examples of when a hafnium oxide and a zirconium oxide is used in the variable resistance layer will be explained hereinafter.

Hereinafter use of a variable resistance layer having a stacked structure comprising hafnium oxide will be described. The variable resistance layer has a stacked structure of a first hafnium oxide layer having a low oxygen concentration, and a second hafnium oxide layer having a high oxygen concentration. It is preferable that the first hafnium oxide have a composition that approximately satisfies $0.9 \leq x \leq 1.6$ when expressed as $HfO_x$ and the second hafnium oxide have a composition that approximately satisfies $1.8 < y$ when expressed as $HfO_y$, and it is preferable that a film thickness of the second hafnium oxide be no less than 3 nm and no more than 4 nm.

When hafnium oxide is used, the variable resistance layer is formed as follows. First, the first hafnium oxide layer is formed on the lower electrode through reactive sputtering in argon gas and oxygen gas using a target of Hf. After the first hafnium oxide layer is formed, the second hafnium oxide layer is formed by exposing the surface of the first hafnium oxide layer to a plasma of argon and oxygen gas. Same as when tantalum oxide is used, the oxygen content atomic percentage of the first hafnium oxide layer can easily be adjusted by changing the flow rate of the oxygen gas with respect to the argon gas in the reactive sputtering. It is to be noted that a substrate does not especially need to be heated; room temperature is acceptable.

Moreover, the film thickness of the second hafnium oxide layer can easily be adjusted by changing the exposure time to the plasma of argon and oxygen gas. When the composition of the first hafnium oxide layer expressed as $HfO_x$ satisfies $0.9 \leq x \leq 1.6$, and the composition of the second hafnium oxide layer expressed as $HfO_y$ satisfies $1.8 < y$, and the film thickness of the second hafnium oxide layer is no less than 3 nm and no more than 4 nm, a stable variable resistance characteristic can be realized.

Hereinafter use of a variable resistance layer having a stacked structure comprising zirconium oxide will be described. The variable resistance layer has a stacked structure of a first zirconium oxide layer having a low oxygen concentration, and a second zirconium oxide layer having a high oxygen concentration. It is preferable that the first zirconium oxide have a composition that approximately satisfies $0.9 \leq x \leq 1.4$ when expressed as $ZrO_x$ and the second zirconium oxide have a composition that approximately satisfies $1.9 < y$ when expressed as $ZrO_y$, and it is preferable that a film thickness of the second zirconium oxide be no less than 1 nm and no more than 5 nm.

When zirconium oxide is used, the variable resistance layer is formed as follows. First, the first zirconium oxide layer is formed on the lower electrode through reactive sputtering in argon gas and oxygen gas using a target of Zr. After the first zirconium oxide layer is formed, the second zirconium oxide layer is formed by exposing the surface of the first zirconium oxide layer to a plasma of argon and oxygen gas. Same as when tantalum oxide is used, the oxygen content atomic percentage of the first zirconium oxide layer can easily be adjusted by changing the flow rate of the oxygen gas with respect to the argon gas in the reactive sputtering. It is to be noted that a substrate does not especially need to be heated; room temperature is acceptable.

Moreover, the film thickness of the second zirconium oxide layer can easily be adjusted by changing the exposure time to the plasma of argon and oxygen gas. When the composition of the first zirconium oxide layer expressed as $ZrO_x$ satisfies $0.9 \leq x \leq 1.4$, and the composition of the second zirconium oxide layer expressed as $ZrO_y$ satisfies $1.9 < y$, and the film thickness of the second zirconium oxide layer is no less than 1 nm and no more than 5 nm, a stable variable resistance characteristic can be realized.

It is to be noted that the present invention is not limited to the above-described embodiments, and various improvements and modifications may be carried out within a scope that does not depart from the essence of the present invention.

The electrode which is in contact with the tantalum oxide layer can be formed, for example, using a material having a standard electrode potential higher than a standard electrode potential of tantalum such as one or a plurality of the following: gold (Au), platinum (Pt), iridium (Ir), palladium (Pd), silver (Ag), and Rhodium (Rh), and it is preferable that the electrode which is in contact with the tantalum oxide layer be formed using a material having a standard electrode potential lower than the material included in electrode which is not in contact with the tantalum oxide layer (W, Ni, or TaN, for example). By adopting such a configuration, a resistance changing operation can be performed stably at the variable resistance layer.

Moreover, the memory device may include a plurality of memory cells having a stacked structure of a plurality of layers.

Moreover, the material included in the upper electrode and the lower electrode is not limited to the material indicated in the embodiments described above; other materials may be used.

Moreover, in the embodiments described above, the source line included in the memory device is arranged to be parallel to the word line, but it is acceptable if the source line is arranged to be parallel to the bit line. Moreover, a configuration is used in which the source line applies a common potential to the transistor, but a configuration in which a source line selection circuit and a source line driver having the same configuration as the row selection circuit and the row driver, respectively, and in which the selected source line and the unselected source line are driven using different voltages (and polarities) is also acceptable.

Various modifications of the exemplary embodiment as well as embodiments resulting from arbitrary combinations of constituent elements of different exemplary embodiments that may be conceived by those skilled in the art are intended to be included within the scope of the present invention as long as these do not depart from the essence of the present invention. For example, a memory system such as a ReRAM memory system (nonvolatile memory device) including the memory device according to the present invention is included within the scope of the present invention.

[Industrial Applicability]

The memory device according to the present invention is useful as a memory device having variable resistance elements in which initial resistance value fluctuations are suppressed by improving the physical connection shape between an electrically connected a line and an upper electrode of the variable resistance elements, and by reducing the film thickness unevenness of the upper electrode.

REFERENCE SIGNS LIST

[Description of Embodiments]
1 substrate
2 source region
3 drain region
4 gate oxide film
5 gate electrode
6 select transistor (transistor)
7 lower electrode
8 variable resistance layer
9 upper electrode
10 variable resistance element
12 lead-out line
13, 17 metal line
14 first insulating layer
15 interlayer insulating layer
16 second insulating layer
18 diffusion layer
50a, 50b, 50c conductive via
100, 200, 300 memory device
201 memory main body
202 memory cell array
203 column selection circuit 204 sense amplifier
205 data input and output circuit
206 write circuit
207 row driver
208 row selection circuit
209 address input circuit
210 control circuit
211 write power source
212 LR power source
213 HR power source
500 nonvolatile memory device
BL0, BL1, BL2 bit line
N11, N12, N13, N14, N21, N22, N23, N24, N31, N32, N33, N34 transistor
M11, M12, M13, M14, M21, M22, M23, M24, M31, M32, M33, M34, memory cell
SL0, SL2 source line
R11, R12, R13, R14, R21, R22, R23, R24, R31, R32, R33, R34 variable resistance element
WL0, WL1, WL2, WL3 word line

The invention claimed is:

1. A memory device comprising:
a plurality of memory cells; and
a lead-out line provided in common to said plurality of memory cells,
wherein each of said memory cells includes:
a transistor formed above a substrate; and
a variable resistance element which includes a lower electrode, an upper electrode comprising a noble metal, and a variable resistance layer disposed between said lower electrode and said upper electrode,
said variable resistance layer has a resistance value that changes reversibly in response to an electric pulse that goes through said transistor and is applied between said lower electrode and said upper electrode,
said lead-out line is in direct contact with said upper electrode included in each of said memory cells, and the bottommost surface of the bottom surface of said lead-out line is formed to be lower than the top surface of said upper electrode and higher than the top surface of said lower electrode, and
said upper electrode is completely covered by said lead-out line.

2. The memory device according to claim 1,
wherein said variable resistance layer includes a first layer comprising an oxygen-deficient first transition metal oxide having a composition represented as $MO_x$ (where M denotes a transition metal and O denotes oxygen) and a second layer comprising a second transition metal oxide having a composition represented as $MO_y$ (where x<y) formed on the first layer, and
the second layer is in contact with said upper electrode.

3. The memory device according to claim 1,
wherein at least a portion of a side wall of said variable resistance layer is covered by an insulating layer.

4. The memory device according to claim 1,
wherein said variable resistance layer comprises a transition metal oxide selected from the group consisting of tantalum, hafnium, and zirconium.

5. The memory device according to claim 1,
wherein said lead-out line has a stacked structure comprising an electrically conductive material, and a portion of said lead-out line that is in direct contact with said upper electrode comprises an electrically conductive material including at least one of chromium, molybdenum, niobium, tantalum, tungsten, titanium, vanadium, zirconium, hafnium, silicon, nitrogen, carbon, and boron.

6. A method of manufacturing a memory device including a plurality of memory cells each of which includes a transistor and a variable resistance element, the method comprising:
forming the transistor above a substrate;
forming a lower electrode of the variable resistance element to correspond to the transistor;
forming a variable resistance layer on the lower electrode;
forming an upper electrode comprising a noble metal on the variable resistance layer;
forming an interlayer insulating layer so as to cover the variable resistance element;
exposing at least a portion of a top surface of the upper electrode; and
forming a lead-out line that is provided in common to the plurality of memory cells so as to be in direct contact with the upper electrode and such that the bottommost surface of the bottom surface of the lead-out line is lower than the top surface of the upper electrode and higher than the top surface of the lower electrode,
the lead-out line being formed such that the upper electrode is completely covered by the lead-out line.

7. The method according to claim 6, comprising:
forming, in the variable resistance layer, a first layer comprising an oxygen-deficient first transition metal oxide having a composition represented as $MO_x$ (where M denotes a transition metal and O denotes oxygen); and
forming, on the first layer, a second layer comprising a second transition metal oxide having a composition represented as $MO_y$ (where x<y).

8. The method according to claim 6,
wherein said exposing
includes planarizing the interlayer insulating layer, and
exposes at least a portion of the upper electrode on a surface of the interlayer insulating layer after planarizing the interlayer insulating layer.

9. The method according to claim 6,
wherein in said forming of a lead-out line, the lead-out line and an other line are formed at the same time.

* * * * *